United States Patent
Pachamuthu et al.

(10) Patent No.: US 9,870,945 B2
(45) Date of Patent: Jan. 16, 2018

(54) CRYSTALLINE LAYER STACK FOR FORMING CONDUCTIVE LAYERS IN A THREE-DIMENSIONAL MEMORY STRUCTURE

(71) Applicant: SanDisk Technologies, Inc., Plano, TX (US)

(72) Inventors: Jayavel Pachamuthu, San Jose, CA (US); Matthias Baenninger, Menlo Park, CA (US); Stephen Shi, Milpitas, CA (US); Johann Alsmeier, San Jose, CA (US); Henry Chien, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/643,280

(22) Filed: Mar. 10, 2015

(65) Prior Publication Data

US 2016/0268209 A1   Sep. 15, 2016

(51) Int. Cl.
*H01L 29/792* (2006.01)
*H01L 29/78* (2006.01)
(Continued)

(52) U.S. Cl.
CPC .. *H01L 21/76883* (2013.01); *H01L 21/28282* (2013.01); *H01L 27/11582* (2013.01); *H01L 21/7682* (2013.01)

(58) Field of Classification Search
CPC ........... H01L 23/53271; H01L 27/1157; H01L 23/5226; H01L 23/528; H01L 21/76843;
(Continued)

(56) References Cited

U.S. PATENT DOCUMENTS 5,915,167 A   6/1999  Leedy
7,005,350 B2  2/2006  Walker et al.
(Continued)

FOREIGN PATENT DOCUMENTS

WO   WO2002/015277 A2   2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Sue A Purvis
*Assistant Examiner* — Thai T Vuong
(74) *Attorney, Agent, or Firm* — The Marbury Law Group PLLC

(57) ABSTRACT

A stack of alternating layers comprising first epitaxial semiconductor layers and second epitaxial semiconductor layers is formed over a single crystalline substrate. The first and second epitaxial semiconductor layers are in epitaxial alignment with a crystal structure of the single crystalline substrate. The first epitaxial semiconductor layers include a first single crystalline semiconductor material, and the second epitaxial semiconductor layers include a second single crystalline semiconductor material that is different from the first single crystalline semiconductor material. A backside contact opening is formed through the stack, and backside cavities are formed by removing the first epitaxial semiconductor layers selective to the second epitaxial semiconductor layers. A stack of alternating layers including insulating layers and electrically conductive layers is formed. Each insulating layer contains a dielectric material portion deposited within a respective backside cavity. Each electrically
(Continued)

conductive layer contains a material from a portion of a respective second epitaxial semiconductor layer.

24 Claims, 17 Drawing Sheets

(51) Int. Cl.
*H01L 21/28* (2006.01)
*H01L 21/336* (2006.01)
*H01L 21/768* (2006.01)
*H01L 27/11582* (2017.01)

(58) Field of Classification Search
CPC ......... H01L 27/11582; H01L 27/11556; H01L 21/76802
USPC ........................................................ 257/314
See application file for complete search history.

(56) References Cited

U.S. PATENT DOCUMENTS

| | | | |
|---|---|---|---|
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,187,936 B2 | 5/2012 | Alsmeier et al. | |
| 2007/0210338 A1 | 9/2007 | Orlowski | |
| 2007/0252201 A1 | 11/2007 | Kito et al. | |
| 2008/0265235 A1* | 10/2008 | Kamigaichi | H01L 27/2409 257/2 |
| 2009/0242967 A1 | 10/2009 | Katsumata et al. | |
| 2010/0044778 A1 | 2/2010 | Seol | |
| 2010/0090286 A1* | 4/2010 | Lee | H01L 27/11526 257/368 |
| 2010/0112769 A1 | 5/2010 | Son et al. | |
| 2010/0120214 A1 | 5/2010 | Park et al. | |
| 2010/0140685 A1* | 6/2010 | Kang | H01L 27/115 257/324 |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0121403 A1* | 5/2011 | Lee | H01L 27/11526 257/390 |
| 2011/0133606 A1 | 6/2011 | Yoshida et al. | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0012920 A1 | 1/2012 | Shin et al. | |
| 2012/0070944 A1* | 3/2012 | Kim | H01L 27/0688 438/128 |
| 2013/0264631 A1 | 10/2013 | Alsmeier | |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M., "3D Cells Make Terabit NAND Flash Possible," Nikkei Electronics Asia, Sep. 17, 2009, 6pgs.

International Search Report & Written Opinion, PCT/US2011/042566, dated Jan. 17, 2012.

Invitation to Pay Additional Fees & Partial International Search Report, PCT/US2011/042566, dated Sep. 28, 2011.

International Search Report, International Application No. PCT/US2013/035567, dated Sep. 30, 2013, 6pgs.

Orlowski, M. et al., "Si, SiGe, Ge, and III-V Semiconductor Nanomembranes and Nanowires Enabled by SiGe Epitaxy" ECS Transactions, vol. 33, No. 6, pp. 777-789, (2010).

* cited by examiner

CRYSTALLINE LAYER STACK FOR FORMING CONDUCTIVE LAYERS IN A THREE-DIMENSIONAL MEMORY STRUCTURE

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises: a stack of layers comprising insulating layers and electrically conductive layers and located over a substrate, and a memory stack structure extending through the stack and comprising, from outside to inside, a memory film and a vertical semiconductor channel. Each of the electrically conductive layers comprises at least one of a single crystalline doped semiconductor material portion and a single crystalline metal-semiconductor alloy portion.

According to another aspect of the present disclosure, a monolithic three-dimensional memory device is provided, which comprises: a stack of layers comprising insulating layers and electrically conductive layers and located over a substrate; and a memory stack structure extending through the stack and comprising, from outside to inside, a memory film and a vertical semiconductor channel. Each of the electrically conductive layers consists entirely of a metal-semiconductor alloy.

According to yet another aspect of the present disclosure, a method of manufacturing a device is provided. A stack of layers comprising first epitaxial semiconductor layers and second epitaxial semiconductor layers is formed over a single crystalline substrate. The first and second epitaxial semiconductor layers are in epitaxial alignment with a crystal structure of the single crystalline substrate, and the first epitaxial semiconductor layers comprise a first single crystalline semiconductor material and the second epitaxial semiconductor layers comprise a second single crystalline semiconductor material that is different from the first single crystalline semiconductor material. A backside contact opening extending through the stack is formed. Backside cavities are formed at each level of the first epitaxial semiconductor layers by removing the first epitaxial semiconductor layers selective to the second epitaxial semiconductor layers and the single crystalline substrate.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1:
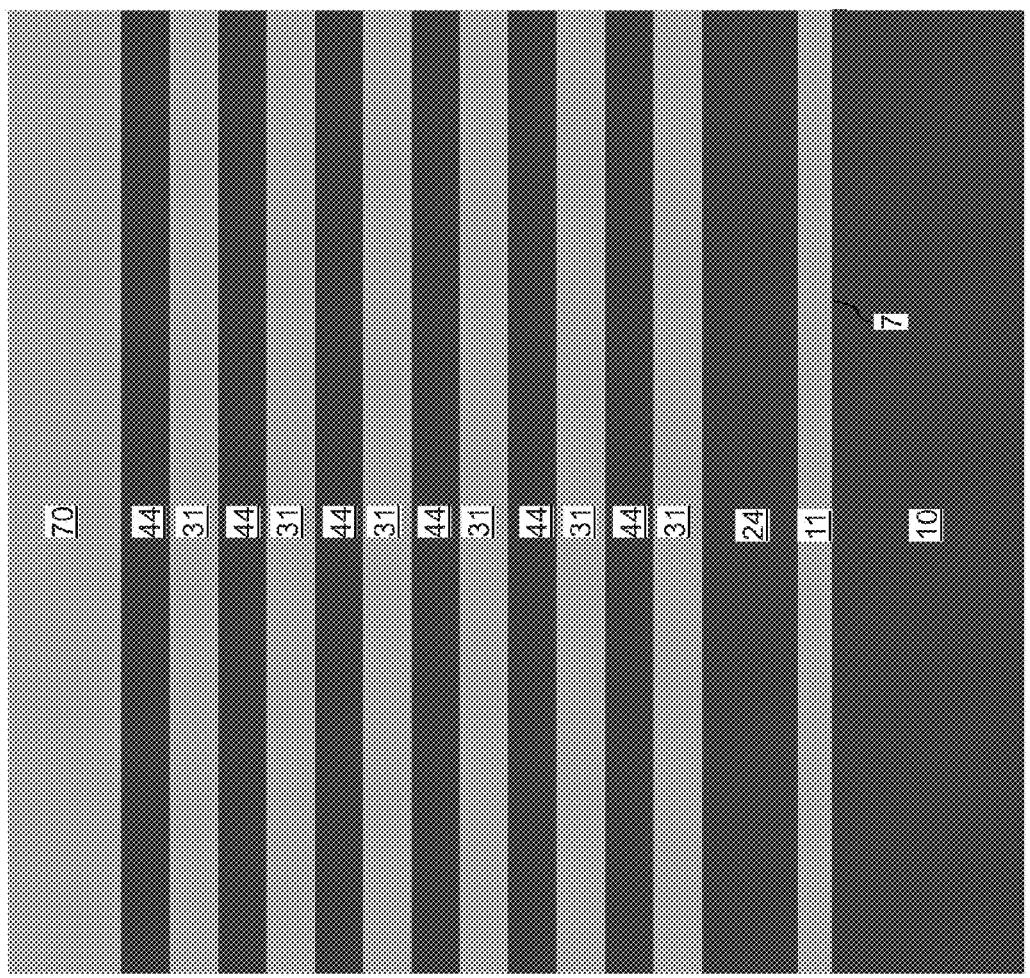
FIG. 1 is a vertical cross-sectional view of a first exemplary structure after formation of a stack including an alternating first epitaxial semiconductor layers and second epitaxial semiconductor layers according to a first embodiment of the present disclosure.

Referring to FIG. 1, a first exemplary structure according to a first embodiment of the present disclosure is illustrated, which can be employed, for example, to fabricate a device structure containing vertical NAND memory devices. The exemplary structure includes a substrate, which can be a single crystalline semiconductor substrate. The substrate can include a single crystalline substrate semiconductor layer 10. The single crystalline substrate semiconductor layer 10 is a single crystalline semiconductor material layer located in the substrate, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the single crystalline substrate semiconductor layer 10. The major surface 7 can be a semiconductor surface. In one embodiment, the major surface 7 can be a single crystalline semiconductor surface. In one embodiment, the single crystalline substrate semiconductor layer 10 can be a doped well (such as a p-doped well) formed by implantation of electrical dopants.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the single crystalline substrate semiconductor layer 10.

At least one semiconductor device (not shown) for a peripheral circuitry can be formed on a portion of the single crystalline substrate semiconductor layer 10. Optionally, the portion of the single crystalline substrate semiconductor layer 10 may be recessed prior to formation of the at least one semiconductor device, or an epitaxial semiconductor material pedestal (not shown) may be formed prior to formation of the at least semiconductor device thereupon. The at least one semiconductor device can include, for example, field effect transistors. The least one semiconductor device for the peripheral circuitry can contain a driver circuit for memory devices to be subsequently formed, which can include at least one NAND device.

A stack of an alternating first epitaxial semiconductor layers (11, 31) and second epitaxial semiconductor layers (24, 44) is formed over the top surface of the substrate. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating first epitaxial semiconductor layers and second epitaxial semiconductor layers may begin with an instance of the first epitaxial semiconductor layers or with an instance of the second epitaxial semiconductor layers, and may end with an instance of the first epitaxial semiconductor layers or with an instance of the second epitaxial semiconductor layers. In one embodiment, an instance of the first elements and an instance of the second elements may form a unit that is repeated with periodicity within the alternating plurality.

Each first epitaxial semiconductor layer (11, 31) includes a first material, and each second epitaxial semiconductor layer (24, 44) includes a second material that is different from the first material. The stack of the alternating plurality is herein referred to as an alternating stack (11, 31, 24, 44). The first material of the first epitaxial semiconductor layers (11, 31) is a semiconductor material that can be deposited on the single crystalline substrate semiconductor layer 10 and on the second material with epitaxial alignment. The second material of the second epitaxial semiconductor layers (24, 44) is a semiconductor material that can be deposited on the first material with epitaxial alignment. The first material of the first epitaxial semiconductor layer (11, 31) is a material that can be removed selective to the second material of the second epitaxial semiconductor layer (24, 44), i.e., a material that can be removed employing an etch chemistry that does not remove the second material of the second epitaxial semiconductor layer (24, 44).

In one embodiment, the first epitaxial semiconductor layers (11, 31) can comprise one or more source-select-level first epitaxial semiconductor layers 11 and control-gate-level first epitaxial semiconductor layers 31. The first material of the one or more source-select-level first epitaxial semiconductor layers 11 may have an identical atomic composition as, or may have a different atomic composition from, the first material of the control-gate-level first epitaxial semiconductor layers 31.

In one embodiment, the second epitaxial semiconductor layers (24, 44) can comprise one or more source-select-level second epitaxial semiconductor layers 24 and control-gate-level second epitaxial semiconductor layers 44. The second material of the one or more source-select-level second epitaxial semiconductor layers 11 may have an identical atomic composition as the second material of the control-gate-level second epitaxial semiconductor layers 31.

The stack of layers comprises first epitaxial semiconductor layers (11, 31) and second epitaxial semiconductor layers (24, 44) formed over a single crystalline substrate which includes the single crystalline substrate semiconductor layer 10. The first and second epitaxial semiconductor layers (11, 31, 24, 44) are in epitaxial alignment with the crystal structure of the single crystalline substrate, and specifically with the single crystalline substrate semiconductor layer 10. The first epitaxial semiconductor layers (11, 31) comprise a first single crystalline semiconductor material, and the second epitaxial semiconductor layers (24, 44) comprise a second single crystalline semiconductor material that is different from the first single crystalline semiconductor material.

The single crystalline substrate semiconductor layer 10 and the first and second epitaxial semiconductor layers (11, 31, 24, 44) can have the same crystalline structure and the same spatial orientations for each crystallographic axis of the crystalline structure. Thus, spatial orientations of crystallographic axes coincide between each of the first and second epitaxial semiconductor layers (11, 31, 24, 44) and the single crystalline semiconductor material layer 10 for each Miller index. In one embodiment, the second epitaxial semiconductor layers (24, 44) can comprise a doped single crystalline semiconductor material. In one embodiment, the second epitaxial semiconductor layers (24, 44) can be deposited with in-situ doping of electrical dopants.

The first and second epitaxial semiconductor layers (11, 31, 24, 44) can be formed in epitaxial alignment with the single crystalline substrate by a set of alternating epitaxial deposition processes. The alternating epitaxial deposition processes can include first epitaxial deposition processes that deposit the first epitaxial semiconductor layers (11, 31), and second epitaxial deposition processes that deposit the second epitaxial semiconductor layers (24, 44).

In one embodiment, the first epitaxial semiconductor layers (11, 31) comprise a single crystalline silicon-germanium alloy, and the second epitaxial semiconductor layers (24, 44) comprise single crystalline silicon. In one embodiment, the first epitaxial semiconductor layers (11, 31) can comprise a silicon-germanium alloy, and the second epitaxial semiconductor layers (24, 44) can comprise doped silicon including electrical dopants (p-type dopants or n-type dopants) at an atomic concentration in a range from $1.0 \times 10^{19}/cm^3$ to $2.5 \times 10^{21}/cm^3$, although lesser and greater atomic concentrations can also be employed. The atomic concentration of germanium in the silicon-germanium alloy may be the same for all of the first epitaxial semiconductor layers (11, 31), or may be different among at least two subsets of the first epitaxial semiconductor layers (11, 31). The atomic concentration of germanium in the silicon-germanium alloy of the first epitaxial semiconductor layers (11, 31) can be in a range from 5% to 60%, in a range from 8% to 50%, in a range from 12% to 35%, and/or in a range from 15% to 30%, although lesser and greater atomic percentages of germanium atoms can also be employed.

The thickness of each of the first epitaxial semiconductor layers (11, 31) and the second epitaxial semiconductor layers (24, 44) can be in a range from 20 nm to 50 nm, although lesser and greater thicknesses can be employed for each first epitaxial semiconductor layer (11, 31) and for each second epitaxial semiconductor layer (24, 44). The number of repetitions of the pairs of a first epitaxial semiconductor layer (11, 31) and a second epitaxial semiconductor layer (24, 44) can be in a range from 2 to 1,024, and typically from 8 to 256, although a greater number of repetitions can also be employed. In one embodiment, each first epitaxial semiconductor layer (11, 31) in the alternating stack (11, 24, 31, 44) can have a uniform thickness that is substantially invariant within each respective first epitaxial semiconductor layer (11, 31), and each second epitaxial semiconductor layer (24, 44) in the alternating stack (11, 24, 31, 44) can have a uniform thickness that is substantially invariant within each respective second epitaxial semiconductor layer (24, 44).

In one embodiment, the thickness of the bottommost second epitaxial semiconductor layer 24 can be greater than the thickness of the other second epitaxial semiconductor layers 44. The thicker second epitaxial semiconductor layer 24 acts as single select gate for the select gate source transistor. In another embodiment, two or more second epitaxial semiconductor layers 24 may be formed as multi-select gates for select gate source transistors. The thickness of the multi-gate select gates as embodied as the second epitaxial semiconductor layers 24 can be uniform, i.e., the thickness can be substantially invariant with translation along horizontal directions. The source-select-level first epitaxial semiconductor layer(s) 11 can have a uniform thickness that is substantially invariant for single gate select gate source transistor and multi-gates select gate source transistor. The thickness of the source-select-level first epitaxial semiconductor layers 11 above the single crystalline substrate semiconductor layer 10 can be less than the thickness of each of the control-gate-level first epitaxial semiconductor layer 31 and each of second epitaxial semiconductor layers (24, 44)

Optionally, an insulating cap layer 70 can be formed over the alternating stack (11, 24, 31, 44). The insulating cap layer 70 includes a dielectric material that is different from the material of the first and second epitaxial semiconductor layers (11, 31, 24, 44). In one embodiment, the insulating cap layer 70 can have a greater thickness than each of the first epitaxial semiconductor layers (11, 31) and each of the second epitaxial semiconductor layers (24, 44). The insulating cap layer 70 can be deposited, for example, by chemical vapor deposition. In one embodiment, the insulating cap layer 70 can be a silicon oxide layer.

Figure 2:
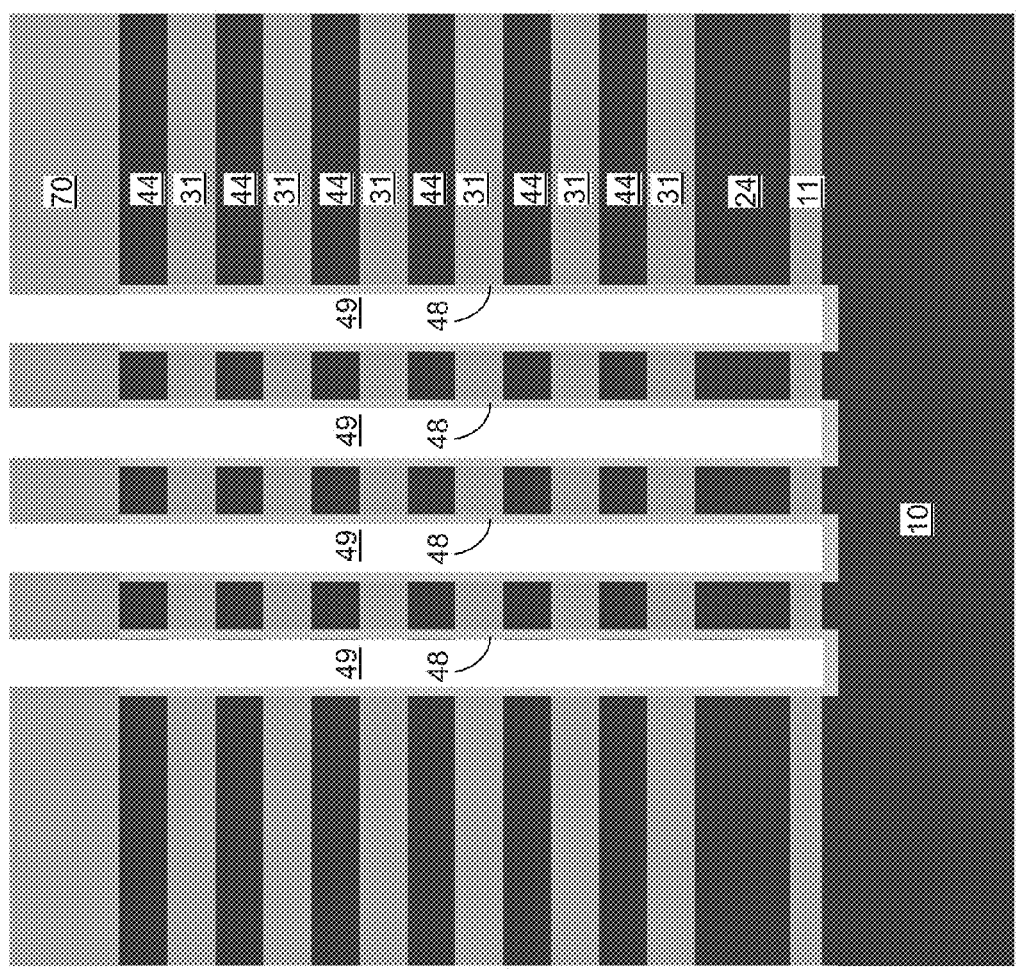
FIG. 2 is vertical cross-sectional view of the first exemplary structure after formation of memory openings and a blocking dielectric layer according to the first embodiment of the present disclosure.

Referring to FIG. 2, a lithographic material stack (not shown) including at least a photoresist layer can be formed over the insulating cap layer 70 and the alternating stack (11, 24, 31, 44), and can be lithographically patterned to form openings therein. The pattern in the lithographic material stack can be transferred through the insulating cap layer 70 and through entirety of the alternating stack (11, 24, 31, 44) by at least one anisotropic etch that employs the patterned lithographic material stack as an etch mask. Portions of the alternating stack (11, 24, 31, 44) underlying the openings in the patterned lithographic material stack are etched to form memory openings 49. In other words, the transfer of the pattern in the patterned lithographic material stack through the alternating stack (11, 24, 31, 44) forms the memory openings 49 that extend through the alternating stack (11, 24, 31, 44). The chemistry of the anisotropic etch process employed to etch through the materials of the alternating stack (11, 24, 31, 44) can alternate to optimize etching of the first and second materials in the alternating stack (11, 24, 31, 44). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 extend at least from the top surface of the alternating stack (11, 24, 31, 44) to the top surface of the single crystalline substrate semiconductor layer 10 within the substrate. In one embodiment, an over-etch into the single crystalline substrate semiconductor layer 10 may be optionally performed. The recess depth into the single crystalline substrate semiconductor layer 10 can be, for example, in a range from 1 nm to 50 nm, although lesser and greater recess depths can also be employed. The region in which the array of memory openings 49 is formed is herein referred to as a device region.

A blocking dielectric layer 48 can be formed on each sidewall of the memory openings 49. The blocking dielectric layer 48 comprises a dielectric material such as silicon oxide and/or a dielectric metal oxide (e.g., aluminum oxide). In one embodiment, the blocking dielectric layer 48 can be formed by thermal oxidation or plasma oxidation (such as in-situ steam generated oxidation) of the semiconductor materials of the alternating stack (11, 24, 31, 44) and the single crystalline substrate semiconductor layer 10. Alternatively or additionally, the blocking dielectric layer 48 can be formed by a conformal deposition process such as chemical vapor deposition (CVD) or atomic layer deposition (ALD). In one embodiment, the blocking dielectric layer 48 can be a silicon oxide layer. The thickness of the blocking dielectric layer 48 can be in a range from 3 nm to 12 nm, although lesser and greater thicknesses can also be employed.

Figure 3:
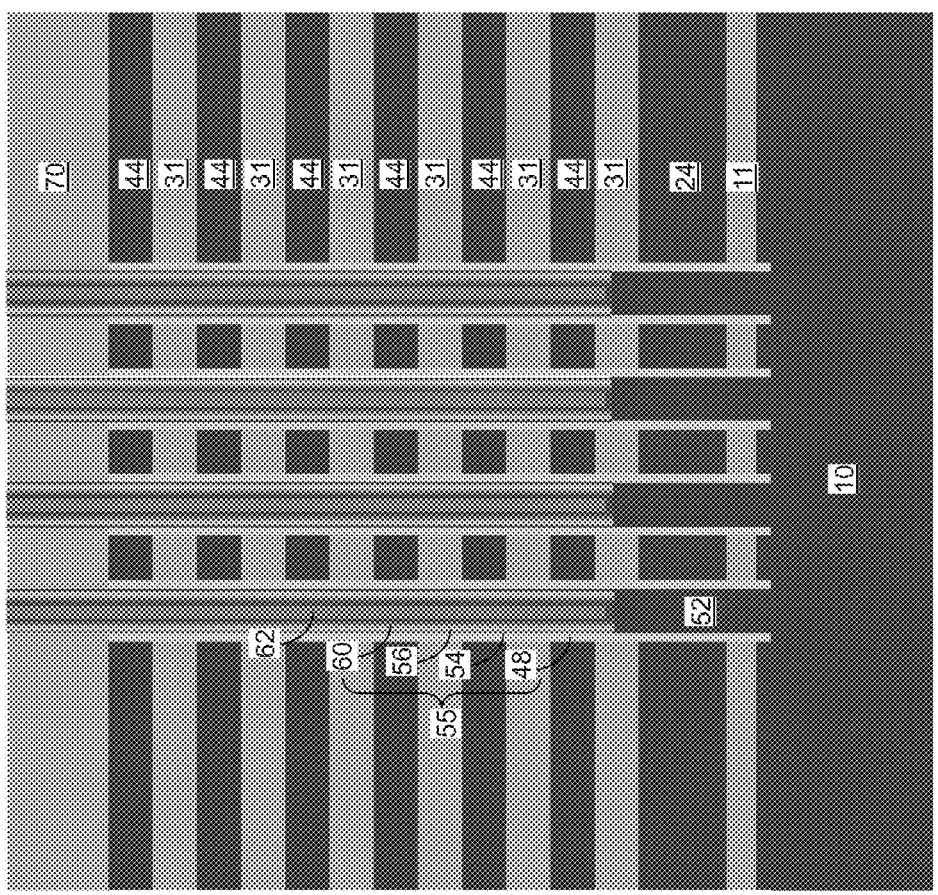
FIG. 3 is a vertical cross-sectional view of the first exemplary structure after formation of epitaxial pedestal channel regions and memory stack structures according to the first embodiment of the present disclosure.

Referring to FIG. 3, horizontal portions of the blocking dielectric layer 48 can be removed from the bottom surface of each memory opening 49 by an anisotropic etch. A top surface of the single crystalline substrate semiconductor layer 10 is physically exposed at the bottom of each memory opening 49.

Optionally, epitaxial pedestal channel regions 52 can be grown from the physically exposed surfaces of the single crystalline substrate semiconductor layer 10 by deposition of a doped semiconductor material. In one embodiment, the epitaxial pedestal channel regions 52 can be formed by depositing a single crystalline doped semiconductor material on a physically exposed surface of the single crystalline substrate underneath the memory openings 49. The epitaxial pedestal channel regions 52 can have a doping of a same conductivity type as the single crystalline substrate semiconductor layer 10 (e.g., p-type). The spatial orientations of crystallographic axes coincide between the single crystalline semiconductor material portions of the alternating stack (11, 24, 31, 44) and the epitaxial pedestal channel region 52 for each Miller index.

Subsequently, a memory material layer 54 and a tunneling dielectric layer 56 can be sequentially formed in each memory opening 49. In one embodiment, the memory material layer 54 can be a charge trapping material including a dielectric charge trapping material, which can be, for example, silicon nitride. Alternatively, the memory material layer 54 can include a conductive material such as doped polysilicon or a metallic material that is patterned into multiple electrically isolated portions (e.g., floating gates), for example, by being formed within lateral recesses into second epitaxial semiconductor layers (24, 44). In one embodiment, the memory material layer 54 includes a silicon nitride layer.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

An optional first semiconductor channel layer (not shown) can be formed by conformal deposition of a semiconductor material. The optional first semiconductor channel layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer includes amorphous silicon or polysilicon. The first semiconductor channel layer can be formed by a conformal deposition method such as low pressure chemical vapor deposition (LPCVD). The thickness of the first semiconductor channel layer can be in a range from 2 nm to 10 nm, although lesser and greater thicknesses can also be employed. A cavity is formed in the volume of each memory opening 49 that is not filled with the deposited material layers.

An anisotropic etch can be formed to remove horizontal portions of the optional first semiconductor channel layer (if present), the tunneling dielectric layers 56, and the memory material layers 54. A top surface of the epitaxial pedestal channel regions 52 can be physically exposed underneath each cavity laterally surrounded by a layer stack of a memory material layer 54 and a tunneling dielectric layer 56.

A second semiconductor channel layer can be deposited directly on the semiconductor surface of the single crystalline substrate semiconductor layer 10 (or on an epitaxial pedestal portion if such an epitaxial pedestal portion is formed by a selective epitaxy process), and directly on the first semiconductor channel portion. The second semiconductor channel layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer includes amorphous silicon or polysilicon. The second semiconductor channel layer can be formed by a conformal deposition method such as low pressure chemical vapor deposition (LPCVD). The thickness of the second semiconductor channel layer can be in a range from 2 nm to 10 nm, although lesser and greater thicknesses can also be employed. The second semiconductor channel layer may partially fill the cavity in each memory opening, or may fully fill the cavity in each memory opening.

The materials of the first semiconductor channel portion and the second semiconductor channel layer are collectively referred to as a semiconductor channel material. In other words, the semiconductor channel material is a set of all semiconductor material in the first semiconductor channel portion and the second semiconductor channel layer.

In case the cavity in each memory opening is not completely filled by the second semiconductor channel layer, a dielectric core layer can be deposited in the cavities to fill any remaining portion of the cavities within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer above the insulating cap layer 70 can be removed by a planarization process, which can include, for example, a recess etch and/or chemical mechanical planarization. Each remaining portion of the dielectric core layer constitutes a dielectric core 62. Further, the horizontal portion of any semiconductor channel layer located above the top surface of the insulating cap layer 70 can be removed by the planarization process. The remaining portions of the first semiconductor channel portion and the second semiconductor channel layer within each memory opening collectively constitutes a vertical semiconductor channel 60, through which electrical current can flow when a vertical NAND device including the vertical semiconductor channel 60 is turned on.

A tunneling dielectric layer 56 is embedded within a memory material layer 54, and laterally surrounds a portion of the vertical semiconductor channel 60. Each adjoining set of blocking dielectric layer 48, a memory material layer 54, a tunneling dielectric layer 56, and a vertical semiconductor channel 60 collectively constitute a memory stack structure 55, which can store electrical charges with a macroscopic retention time. As used herein, a macroscopic retention time refers to a retention time suitable for operation of a memory device as a permanent memory device such as a retention time in excess of 24 hours. Each memory stack structure 55 comprises a vertical semiconductor channel 60 and a memory film (48, 54, 56).

Figure 4:
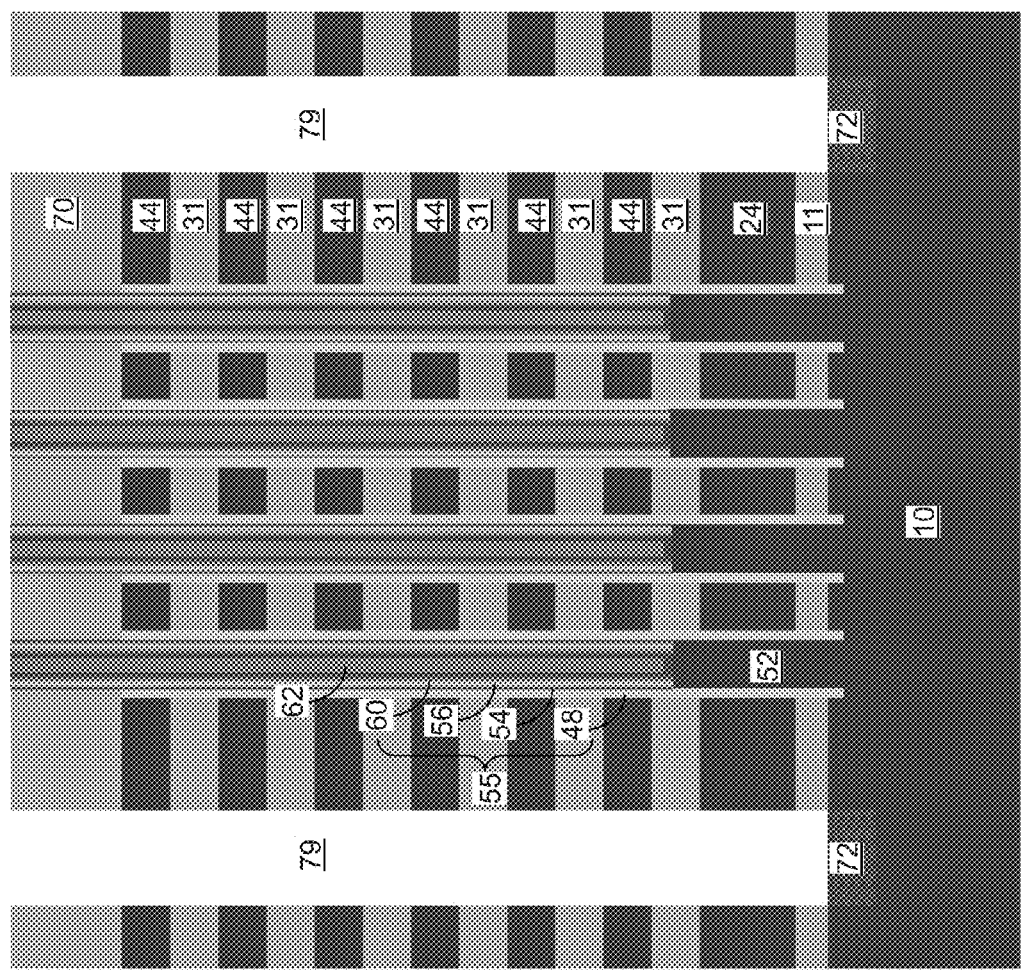
FIG. 4 is a vertical cross-sectional view of the first exemplary structure after formation of backside contact openings and source regions according to the first embodiment of the present disclosure.

Referring to FIG. 4, a photoresist layer (not shown) can be applied over the alternating stack (11, 24, 31, 44) and the insulating cap layer 70, and lithographically patterned to form openings therein. The pattern in the photoresist layer can be transferred through the insulating cap layer 70 and the alternating stack (11, 24, 31, 44) by an anisotropic etch. At least one backside contact opening 79 (which may be at least one laterally elongated trench) is formed in each area underlying the openings in the photoresist layer. In one embodiment, the at least one backside contact opening 79 can include a source contact opening in which a source contact via structure can be subsequently formed. If desired, source regions 72 may be formed by implantation of dopant atoms into a portion of the single crystalline substrate semiconductor layer 10 through the backside contact openings 79. In one embodiment, the source regions 72 can have a doping of the opposite conductivity type (e.g., n-type) with respect to the doping of the single crystalline substrate semiconductor layer 10 (e.g., p-type) and the vertical semiconductor channels 60. The photoresist layer can be subsequently removed, for example, by ashing.

Figure 5:
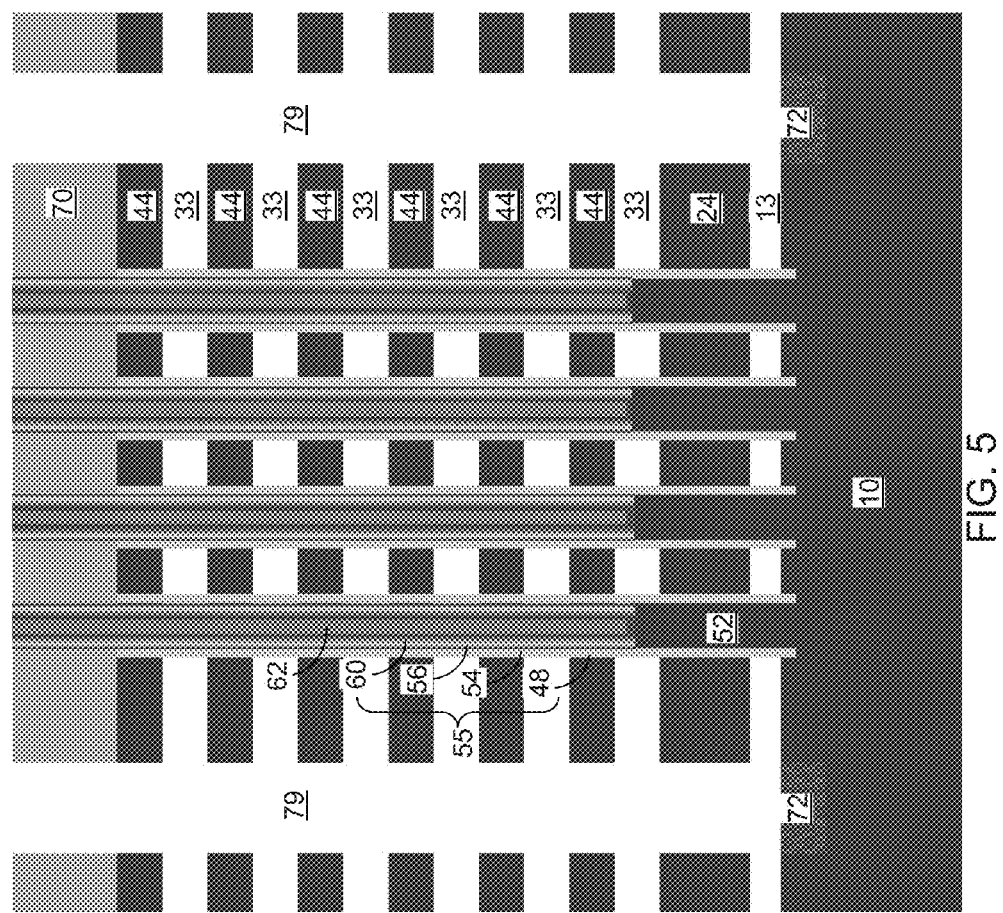
FIG. 5 is a vertical cross-sectional view of the first exemplary structure after formation of insulator-level backside cavities according to the first embodiment of the present disclosure.

Referring to FIG. 5, backside cavities are formed at each level of the first epitaxial semiconductor layers (11, 31) by removing the first epitaxial semiconductor layers (11, 31) selective to the second epitaxial semiconductor layers (24, 44) and the single crystalline substrate. Specifically, an etchant that removes the first material of the first epitaxial semiconductor layers (11, 31) selective to the second material of the second epitaxial semiconductor layers (24, 44) is introduced into the backside contact openings 79 in a liquid phase (in a wet etch) or in a gas phase (in a dry etch). The first material of the first epitaxial semiconductor layers (11, 31) is removed to form insulator-level backside cavities (13, 33) at each level from which the first epitaxial semiconductor layers (11, 31) are removed. The insulator-level backside cavities (13, 33) refer to backside cavities that are formed at insulator levels, which are levels at which insulating layers are to be subsequently formed. As used herein, a backside cavity refers to a cavity that is formed on the outside of the memory openings. In contrast, the memory openings 49 are herein referred to as front side openings. The insulator-level backside cavities (13, 33) comprise one or more source-select-level backside cavities 13 and control-gate-level backside cavities 33.

The removal of the first epitaxial semiconductor layers (11, 31) is selective to the second epitaxial semiconductor layers (24, 44), the memory stack structures 55, and the semiconductor material of the single crystalline substrate semiconductor layer 10. In one embodiment, the first epitaxial semiconductor layers (11, 31) can comprise a silicon-germanium alloy, the second epitaxial semiconductor layers (24, 44) can comprise doped single crystalline silicon, and the single crystalline substrate semiconductor layer 10 can be a silicon layer. In this case, the selective removal of the first epitaxial semiconductor layers (11, 31) can be performed by a wet etch employing a combination of hydrogen peroxide and dilute hydrofluoric acid. Alternatively, a silicon-germanium alloy in the first epitaxial semiconductor layers (11, 31) can be more rapidly etched than silicon in fluorine-based, chlorine-based, and/or bromine-based low pressure plasmas with high selectivity. An alternating stack of insulator-level backside cavities (13, 33) and the second epitaxial semiconductor layers (24, 44) is formed.

Figure 6:
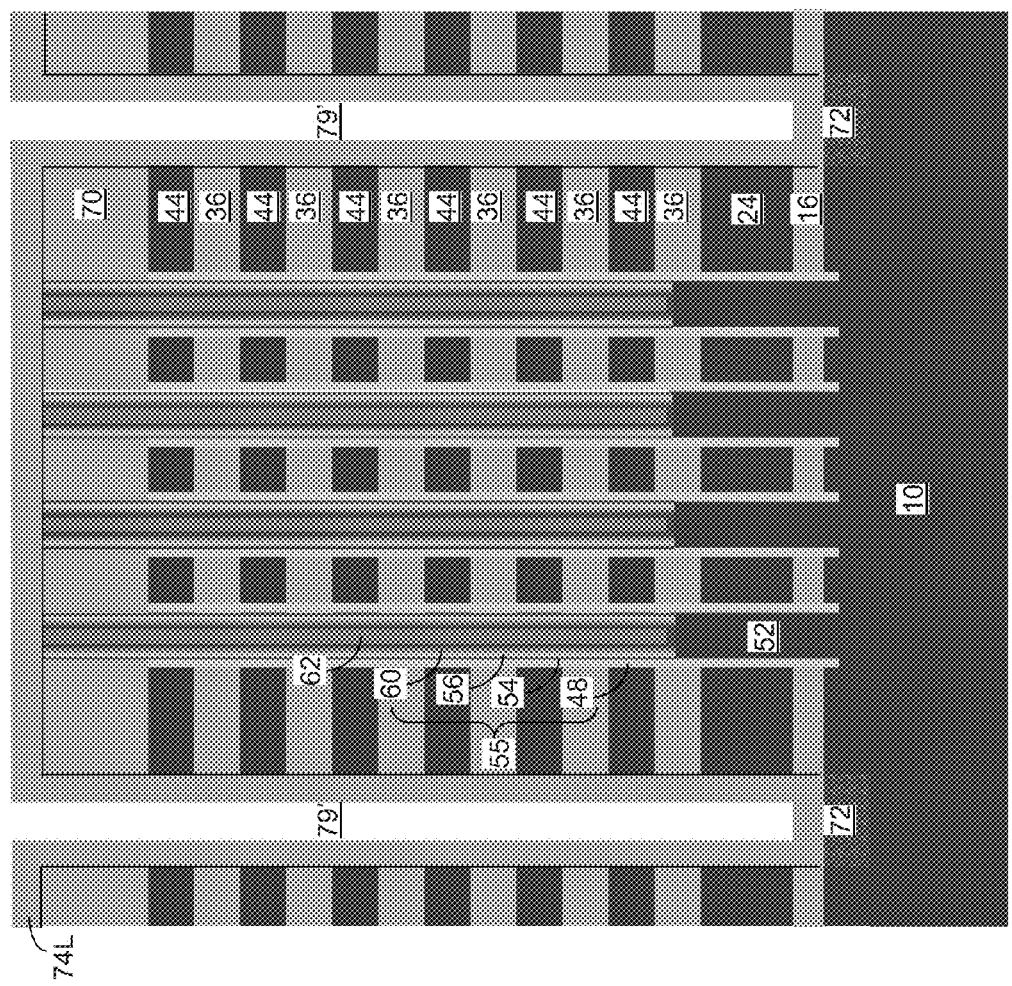
FIG. 6 is a vertical cross-sectional view of the first exemplary structure after formation of insulating layers and a conformal dielectric layer according to an embodiment of the present disclosure.

Referring to FIG. 6, a dielectric material is deposited by a conformal deposition method (such as chemical vapor deposition) to simultaneously form insulating layers (16, 36) and a conformal dielectric layer 74L. The portions of the deposited dielectric material that fill the volumes of the one or more source-select-level backside cavities 13 constitute one or more source-select-level insulating layers 16. The portions of the deposited dielectric material that fill the volumes of the control-gate-level backside cavities 33 constitute control-gate-level insulating layers 36. The contiguous portion of the deposited dielectric material that is deposited on the sidewalls of the backside contact openings 79 and over the top surface of the insulating cap layer 70 constitutes the conformal dielectric layer 74L. The source-select-level insulating layers 16 and the control-gate-level insulating layers 36 are collectively referred to as insulating layers (16, 36).

The thickness of the deposited dielectric material can be selected such that the insulator-level backside cavities (13, 33) are completely filled by the insulating layers 36, and the backside contact cavities 79 are not completely filled by the conformal dielectric layer 74L. Thus, a backside contact cavity 79' is present within each backside contact opening 79 after formation of the conformal dielectric layer 74L. The dielectric material of the insulating layers 36 and the conformal dielectric layer 74L can be silicon oxide, silicon nitride, organosilicate glass, a dielectric metal oxide, or a combination thereof.

Each of the second epitaxial semiconductor layers (24, 44) can be an electrically conductive layer, i.e., a layer comprising a conductive material having electrical conductivity greater than $1.0 \times 10^5$ S/cm. An alternating stack (16, 36, 24, 44) of layers comprising insulating layers (16, 36) and electrically conductive layers (i.e., the second epitaxial semiconductor layers (24, 44)) is formed. Each insulating layer (16, 36) comprises a dielectric material portion deposited within a respective backside cavity (13, 33). Each electrically conductive layer comprises a material from at least a portion of a respective second epitaxial semiconductor layer (24, 44). In one embodiment, the second epitaxial semiconductor layers (24, 44) comprise a doped single crystalline semiconductor material, and the electrically conductive layers consist entirely of the second epitaxial (i.e., single crystalline) semiconductor layers (24, 44).

Figure 7:
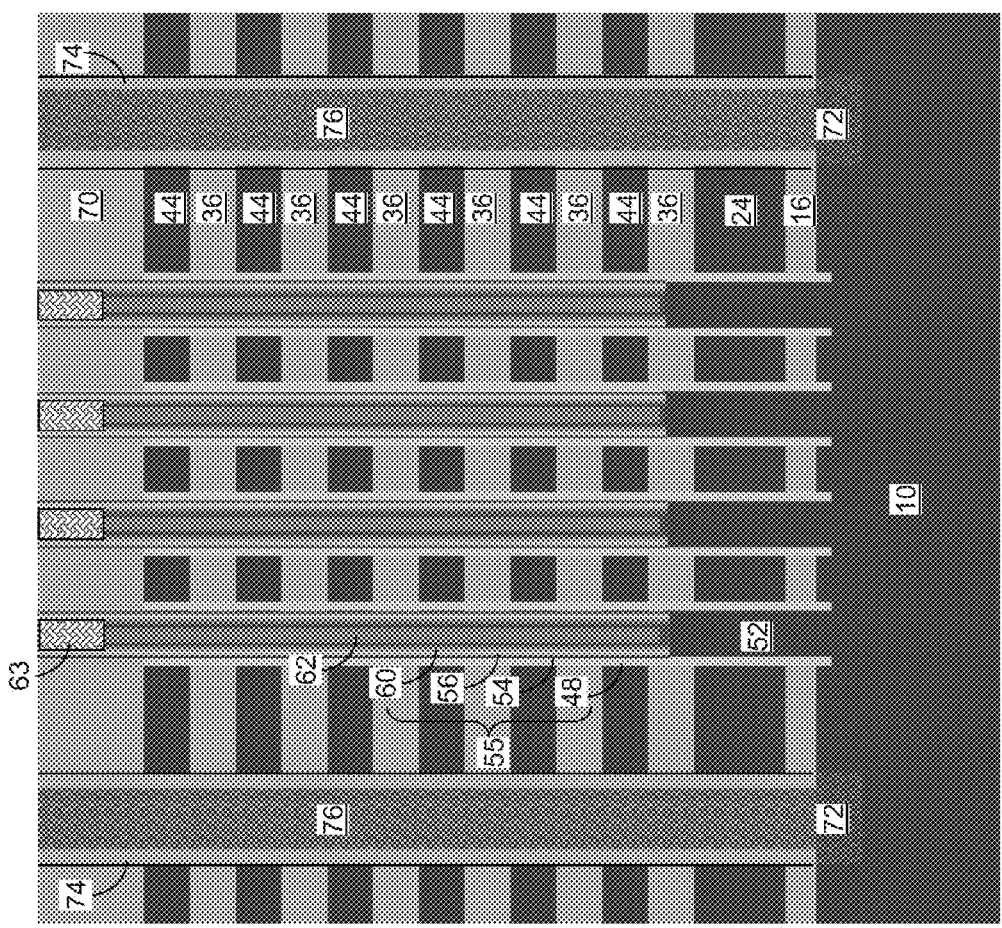
FIG. 7 is a vertical cross-sectional view of the first exemplary structure after formation of backside contact via structures according to the first embodiment of the present disclosure.

Referring to FIG. 7, an anisotropic etch can be performed to remove horizontal portions of the conformal dielectric layer 74L. A top surface of a source region 72 is physically exposed underneath each backside contact cavity 79'. Each remaining vertical portion of the conformal dielectric layer 74L constitutes an insulating spacer 74. A backside contact via structure 76 can be formed within each backside contact cavity by deposition of a conductive material (which can comprise a metallic material such as TiN, W, and/or Cu) and removal of excess portions of the conductive material from above a horizontal plane including the top surface of the insulating cap layer 70 by a planarization process such as chemical mechanical planarization and/or a recess etch.

A photoresist layer (not shown) can be formed over the insulating cap layer 70, and can be lithographically patterned to formed openings in regions overlying the dielectric cores 62. An etch process can be performed to recess an upper portion of each dielectric core 62 to form cavities overlying remaining portions of the dielectric cores 62. The cavities can be filled with a doped semiconductor material to form drain regions 63. The drain regions 63 can have a doping of the same conductivity type (e.g., n-type) as the source regions 72.

The first exemplary structure can comprise a monolithic three-dimensional memory device. The monolithic three-dimensional memory device comprises a stack of layers comprising insulating layers (16, 36) and electrically conductive layers (24, 44) and located over a substrate, a memory stack structure 55 extending through the stack and comprising, from outside to inside, a memory film (48, 54, 56) and a vertical semiconductor channel 60. Each of the electrically conductive layers (24, 44) comprises a single crystalline doped semiconductor material portion.

In one embodiment, the substrate comprises a single crystalline semiconductor material layer 10 having a same crystal structure as the single crystalline doped semiconductor material portions. Spatial orientations of crystallographic axes coincide between each of the single crystalline doped semiconductor material portions and the single crystalline semiconductor material layer 10 for each Miller index. In one embodiment, the single crystalline doped semiconductor material portions comprise single crystalline doped silicon portions. In one embodiment, each of the single crystalline doped semiconductor material portions contacts an outer sidewall of a memory stack structure 55.

In one embodiment, each of the electrically conductive layers 46 consists entirely of a respective single crystalline doped semiconductor material portion. In one embodiment, an entire volume within surfaces of each of the insulating layers is filled with a dielectric material. A backside contact via structure 76 extends through the stack (16, 36, 24, 44) and contacts a portion of the substrate, e.g., a source region 72. An insulating spacer 74 laterally surrounds the backside contact via structure 76. Each of the electrically conductive layers (24, 44) contacts an outer sidewall of the insulating spacer 74.

In one embodiment, the monolithic three-dimensional memory device can be a vertical NAND memory device, and one or more of the electrically conductive layers (24, 44) comprise, or are electrically connected to, a respective word line of the vertical NAND memory device. For example, the control-gate-level second epitaxial semiconductor layers 44 can comprise word lines of the vertical NAND memory device. Further, one or more source select level gate electrodes 24 can be located underneath the word lines of the vertical NAND memory device. For example, the one or more source-select-level second epitaxial semiconductor layers 24 can comprise the one or more source select level gate electrodes. Each source select level gate electrode comprises a single crystalline doped semiconductor material portion.

In one embodiment, the monolithic three-dimensional memory device can comprise an epitaxial pedestal channel region 52 located at a bottom portion of the memory stack structure 55 and laterally surrounded by the source select level gate electrode 24. The single crystalline doped semiconductor material portions of the electrically conductive layers (24, 44) and the epitaxial pedestal channel region 52 can have a same crystal structure. Further, spatial orientations of crystallographic axes coincide between the single crystalline doped semiconductor material portions and the epitaxial pedestal channel region 52 for each Miller index.

In one embodiment, the substrate can comprise a silicon substrate, and the NAND memory device can comprise an array of monolithic three-dimensional NAND strings over the silicon substrate. At least one memory cell in the first device level of the three-dimensional array of NAND strings can be located over another memory cell in the second device level of the three-dimensional array of NAND strings. The silicon substrate can contain an integrated circuit comprising a driver circuit for the memory device located thereon. The array can comprise a plurality of semiconductor channels (e.g., one semiconductor channel per NAND string). At least one end portion of each of the plurality of semiconductor channels extends substantially perpendicular to a top surface of the semiconductor substrate. Each NAND string can comprise a plurality of charge storage elements. Each charge storage element can be located adjacent to a respective one of the plurality of semiconductor channels, e.g., within a memory film (48, 54, 56). Each NAND string can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

Figure 8:
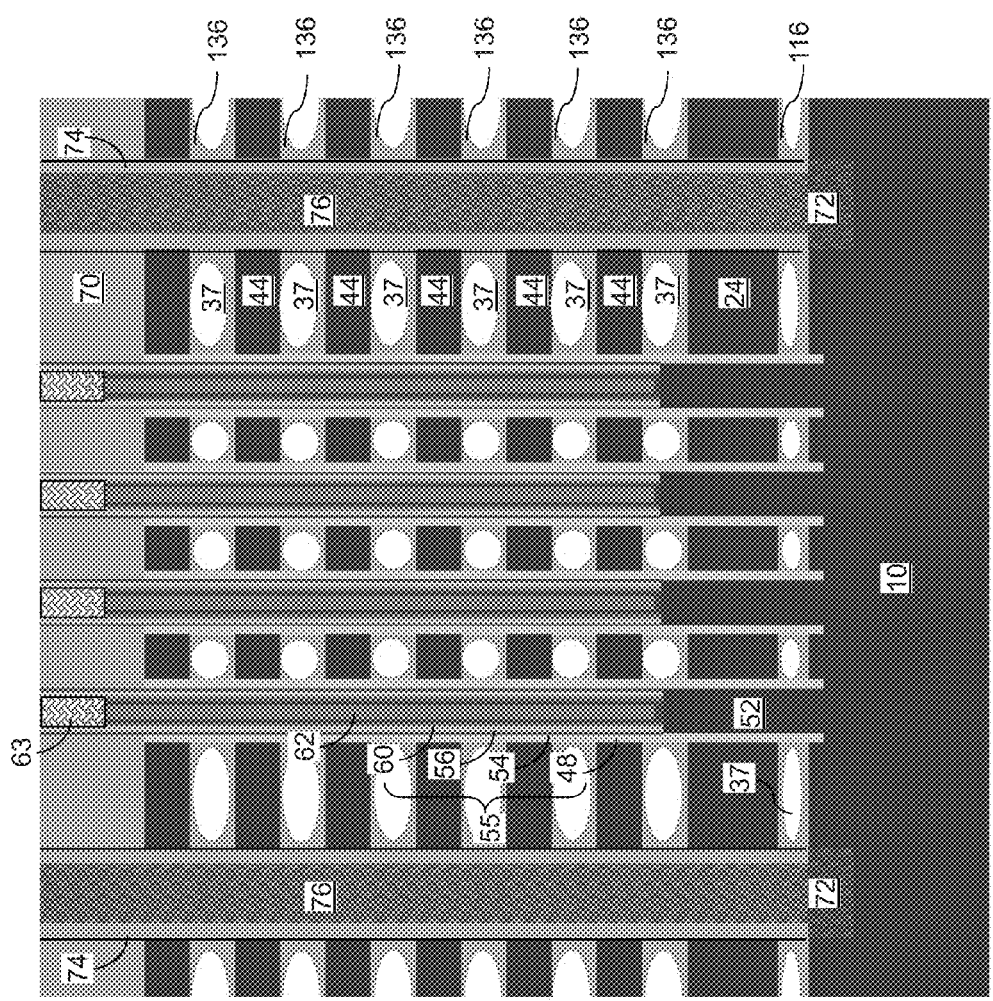
FIG. 8 is a vertical cross-sectional view of an alternate embodiment of the first exemplary structure according to the first embodiment of the present disclosure.

Referring to FIG. 8, an alternate embodiment of the first exemplary structure can be derived from the first exemplary structure of FIGS. 5-7 by employing a non-conformal deposition process to deposit a dielectric material within the insulator-level backside cavities (13, 33) in lieu of a conformal deposition process illustrated in FIG. 6. The portions of the deposited dielectric material that fill the volumes of the one or more source-select-level backside cavities 13 constitute select-gate-level insulating layers 116. The portions of the deposited dielectric material that fill the volumes of the control-gate-level backside cavities 33 constitute control-gate-level insulating layers 136. The contiguous portion of the deposited dielectric material that is deposited on the sidewalls of the backside contact openings 79 and over the top surface of the insulating cap layer 70 constitutes a non-conformal contiguous dielectric layer. The source-select-level insulating layers 116 and the control-gate-level insulating layers 136 are collectively referred to as insulating layers (116, 136).

In this case, each insulating layer (116, 136) that is formed within an insulator-level backside cavity (13, 33) can have at least one encapsulated cavity 37 therein. As used herein, an "encapsulated cavity" refers to a cavity located within a sealed volume defined by a set of surfaces that does not include any opening therein. An encapsulated cavity does not include any solid material or any liquid material, but may contain one or more gases. Non-limiting examples of encapsulated cavities include an air cavity, a gas-filled cavity, and a vacuum cavity. The maximum dimension of the encapsulated cavities 37 within each insulating layer (116, 136) can be greater than 3 nm, and can be greater than 10 nm. The insulating layers (116, 136) comprise a dielectric material such as silicon oxide, silicon oxynitride, and/or organosilicate glass. The insulating layers (116, 136) can be formed, for example, by plasma enhanced chemical vapor deposition (PECVD) or high density plasma chemical vapor deposition (HDPCVD), which are non-conformal deposition methods. Alternatively, the insulating layers (116, 136) may be omitted entirely, and the insulator level backside cavities (13, 33) may contain encapsulated cavities 37 after formation of the insulating spacers 74.

The processing steps of FIG. 7 can be subsequently performed to form insulating spacers 74, the backside contact via structures 76, and the drain regions 63. The insulating spacers 74 of FIG. 8 can have a tapered profile, i.e., a vertically changing thickness that is lesser at a lower portion and greater at an upper portion. The exemplary structure of FIG. 7 can be modified such that each of the insulating layers (116, 136) in the stack (116, 136, 24, 44) comprises at least one cavity 37 embedded therein.

Figure 9:
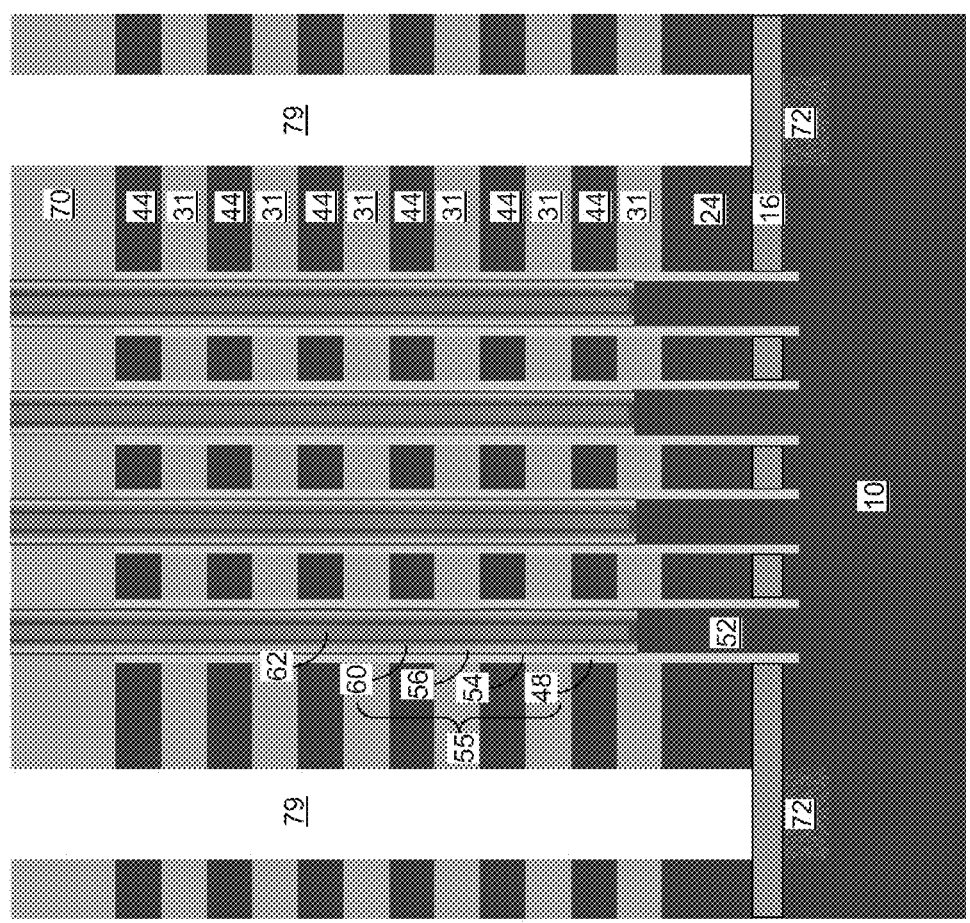
FIG. 9 is a vertical cross-sectional view of a second exemplary structure after formation of one or more source-select-level insulator layers according to a second embodiment of the present disclosure.

Referring to FIG. 9, a second exemplary structure according to a second embodiment of the present disclosure can be derived from the first exemplary structure of FIG. 4 by removing the one or more select-gate-level first epitaxial semiconductor layers 11 selective to the control-gate-level first epitaxial semiconductor layers 31, the second epitaxial semiconductor layers (24, 44), and the single crystalline substrate semiconductor layer 10.

In one embodiment, the first material of the one or more source-select-level first epitaxial semiconductor layers 11 can have a different composition than the first material of the control-gate-level first epitaxial semiconductor layers 31. In other words, the first epitaxial semiconductor layers (11, 31) can comprise a first subset (e.g., the source-select-level first epitaxial semiconductor layers 11) having a first semiconductor composition, and a second subset (e.g., the control-gate-level first epitaxial semiconductor layers 31) having a second semiconductor composition. For example, the first material of the one or more source-select-level first epitaxial semiconductor layers 11 can be a first silicon-germanium alloy having a first germanium atomic concentration, and the first material of the control-gate-level first epitaxial semiconductor layers 31 can be a second silicon-germanium alloy having a second germanium atomic concentration that is lesser than the first germanium atomic concentration. For example, the first germanium atomic concentration can be in a range from 5% to 20%, and the second germanium atomic concentration can be in a range from 25% to 60%.

Two sets of backside cavities (13, 33) are sequentially formed as illustrated in FIG. 5. Specifically, a first subset 13 of the backside cavities (13, 33), i.e., the one or more source-select-level backside cavities 13, is formed by removing a first subset of the first epitaxial semiconductor layers, i.e., the one or more select-gate-level first epitaxial semiconductor layers 11, selective to a second subset of the first epitaxial semiconductor layers, i.e., the control-gate-level first epitaxial semiconductor layers 31, selective to the second epitaxial semiconductor layers (24, 44), and selective to the single crystalline substrate semiconductor layer 10. An etch chemistry that etches a silicon-germanium alloy having a higher germanium atomic concentration, such as the second germanium atomic concentration, selective to a silicon-germanium alloy having a lower germanium atomic concentration, such as the first germanium atomic concentration, and silicon can be employed. For example, a wet etch chemistry employing hydrogen peroxide and dilute hydrogen fluoride can be employed to etch the one or more select-gate-level first epitaxial semiconductor layers 11 selectively, and to form the one or more source-select-level backside cavities 13. Alternatively or additionally, a wet etch chemistry employing hydrogen peroxide, nitric acid, and acetic acid may be employed to form the one or more source-select-level backside cavities 13.

A dielectric material is deposited in the one or more source-select-level backside cavities 13, on the sidewalls of the backside contact openings 79, and over the insulating cap layer 70 by a conformal deposition process. The dielectric material can be, for example silicon oxide, silicon nitride, organosilicate glass, or a combination thereof. The portions of the deposited dielectric material on the sidewalls of the backside contact openings 79 and over the insulating cap layer 70 can be removed, for example, by an isotropic etch such as a wet etch. The duration of the isotropic etch is selected such that the portions of the dielectric material in the one or more source-select-level backside cavities 13 are not removed. The remaining portions of the dielectric material that remains in the one or more source-select-level backside cavities 13 constitute one or more source-select-level insulating layers 16. The one or more source-select-level insulating layers 16 are formed in the first subset 13 of the backside cavities (13, 33), which constitute a first subset of the insulating layers to be formed in the second exemplary structure.

Figure 10:
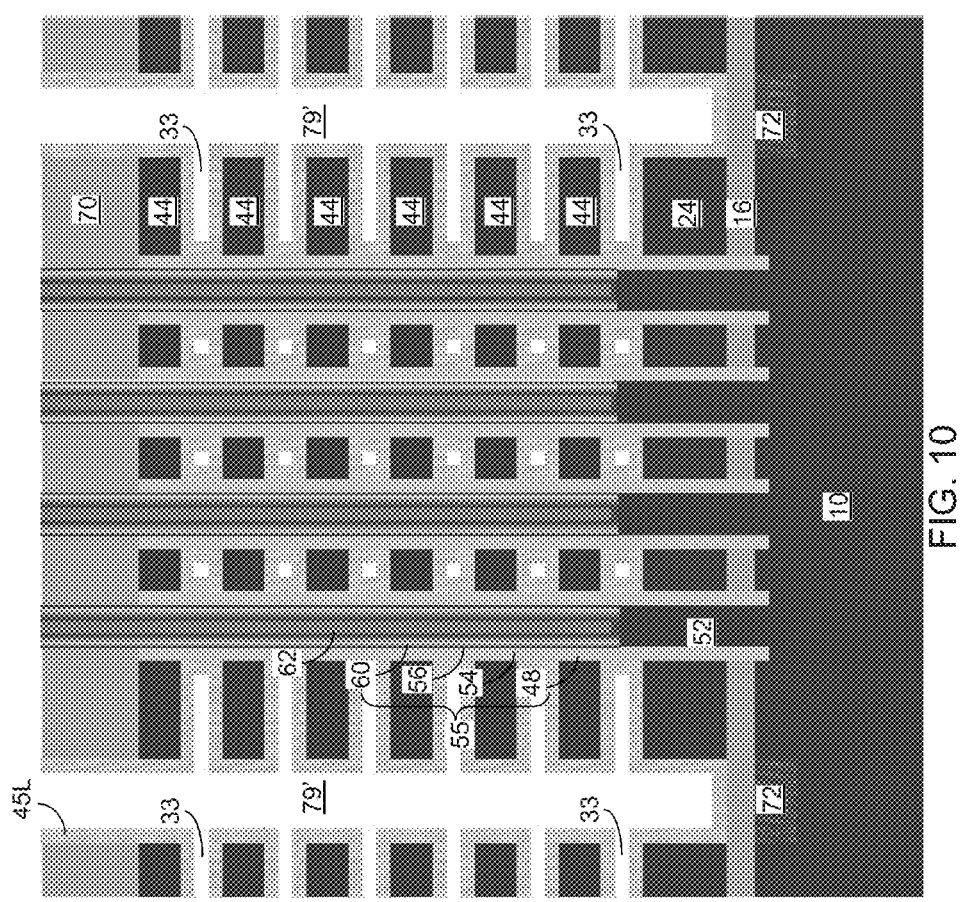
FIG. 10 is a vertical cross-sectional view of the second exemplary structure after deposition of a metal layer in insulator-level backside cavities according to a second embodiment of the present disclosure.

Referring to FIG. 10, a second subset 33 of the backside cavities (13, 33) is formed after formation of the one or more source-select-level insulating layers 16. The second subset 33 of the backside cavities (13, 33) comprises control-gate-level backside cavities 33, which are formed by removing a second subset 31 of the first epitaxial semiconductor layers (11, 31), i.e., the control-gate-level first epitaxial semiconductor layers 31, selective to the first subset of the insulating layers, i.e., the one or more source-select-level insulating layers 16, and selective to the second epitaxial semiconductor layers (24, 44).

A metal layer 45L is deposited on the surfaces of the second epitaxial semiconductor layers (24, 44) in the second subset 33 of the backside cavities, i.e., in the control-gate-level backside cavities 33, by a conformal deposition such as chemical vapor deposition (CVD). The metal layer 45L can be deposited on horizontal surfaces and at least one vertical surface of each second epitaxial semiconductor layer (24, 44). The metal layer 45L comprises at least one elemental metal that forms a metal-semiconductor alloy upon anneal. In one embodiment, the second epitaxial semiconductor layers (24, 44) can comprise silicon or a silicon-containing alloy, and the metal layer 45L can comprise a material that forms a metal silicide. For example, the metal layer 45L can comprise an elemental metal or an alloy of elemental metals, which can be selected from nickel, cobalt, titanium, tantalum, tungsten, platinum, or a combination thereof. A backside contact cavity 79' can be present within each backside contact opening after formation of the metal layer 45L. The metal layer 45L can be formed as a single contiguous layer.

Figure 11:
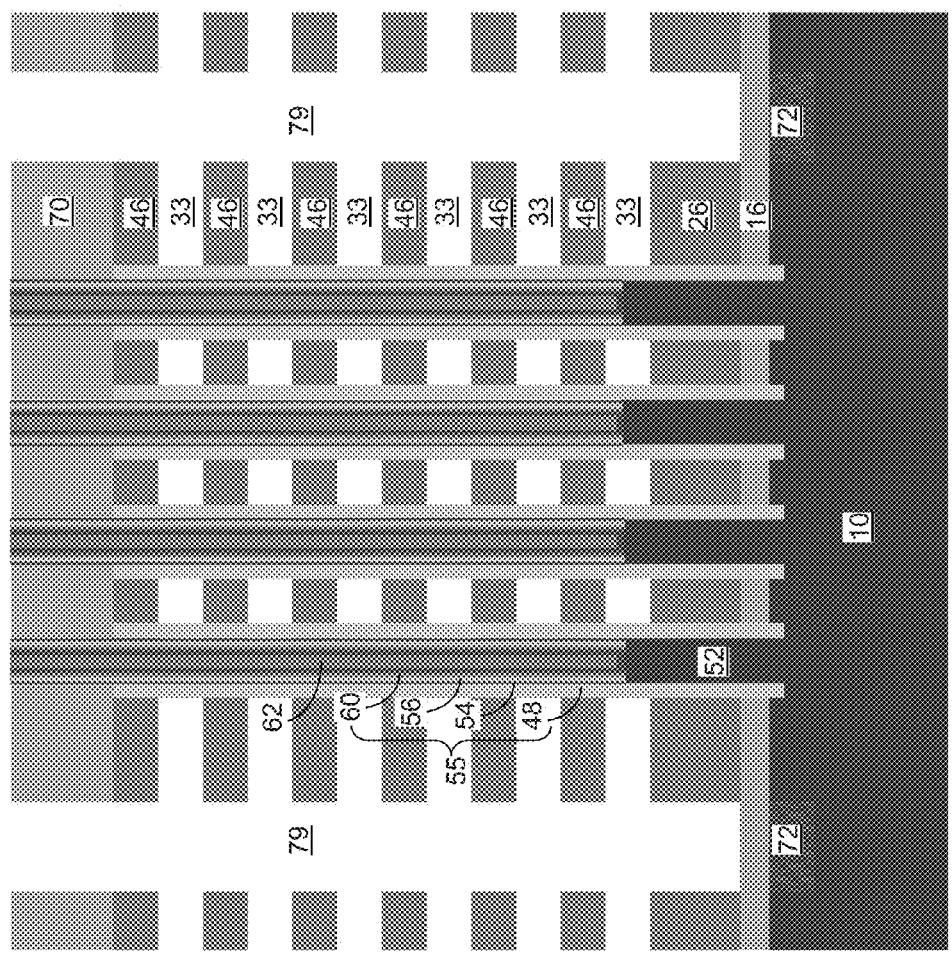
FIG. 11 is a vertical cross-sectional view of the second exemplary structure after formation of metal-semiconductor alloy conductive layers according to the second embodiment of the present disclosure.

Referring to FIG. 11, reaction between the metal layer 45L and the second epitaxial semiconductor layers (24, 44) is induced employing an anneal process to form metal-semiconductor alloy layers (26, 46). At least a portion of each second epitaxial semiconductor layer (26, 46) can be converted into a metal-semiconductor alloy portion by reacting the metal layer 45L with the second epitaxial semiconductor layers (24, 44) employing the anneal process. Specifically, the anneal process is performed at an elevated temperature to induce metallization of the semiconductor material of the second epitaxial semiconductor layers (24, 44), thereby converting each of the second epitaxial semiconductor layers (24, 44) into a respective metal-semiconductor alloy layer (26, 46). The elevated temperature can be in a range from 400 degrees Celsius to 800 degrees Celsius, although lower and higher temperatures can also be employed. In one embodiment, the metal-semiconductor alloy layers (26, 46) can include a metal silicide such as nickel silicide, cobalt silicide, titanium silicide, tantalum silicide, tungsten silicide, and/or platinum silicide.

The metal-semiconductor alloy layers (26, 46) include one or more source-select-level metal-semiconductor alloy layers 26 and control-gate-level metal-semiconductor alloy layers 46. Each metal-semiconductor alloy layer (26, 46) constitutes an electrically conductive layer. Thus, each electrically conductive layer comprises a respective metal-semiconductor alloy portion. In one embodiment, the anneal process converts an entirety of each second epitaxial semiconductor layer (24, 44) into a metal-semiconductor alloy layer (26, 46) such that the entire electrically conductive layers consist of a metal-semiconductor alloy. In one embodiment, each metal-semiconductor alloy layer 46 can be single crystalline. Alternatively, the metal-semiconductor alloy layers 46 may be polycrystalline.

Figure 12:
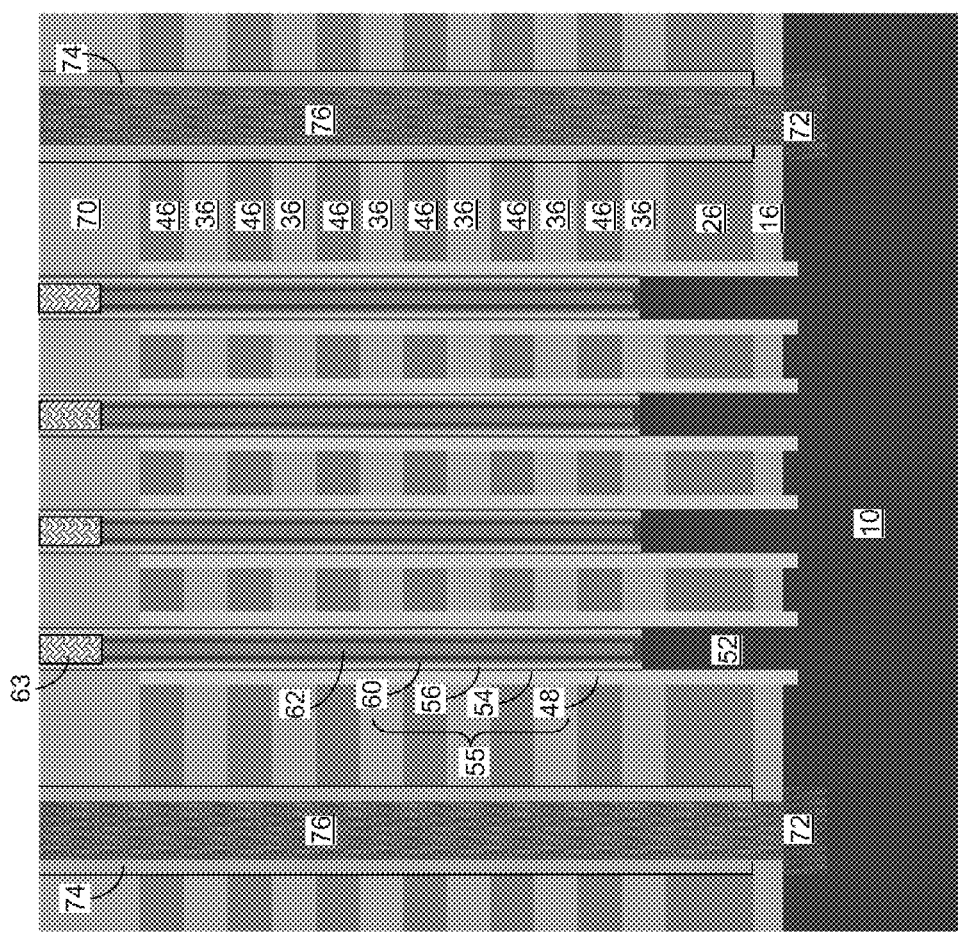
FIG. 12 is a vertical cross-sectional view of the second exemplary structure after formation of insulating layers, insulating spacers, and backside contact via structures according to the second embodiment of the present disclosure.

Referring to FIG. 12, a second subset 36 of the insulating layers (16, 36), i.e., control-gate-level insulating layers 36, is formed in the second subset 33 of the backside cavities, i.e., in the control-gate-level backside cavities 33, after formation of the metal-semiconductor alloy layers (26, 46). Specifically, a dielectric material is deposited by a conformal deposition method (such as chemical vapor deposition) to form the control-gate-level insulating layers 36 and a conformal dielectric layer. The portions of the deposited dielectric material that fill the volumes of the control-gate-level backside cavities 33 constitute the control-gate-level insulating layers 36. The contiguous portion of the deposited dielectric material that is deposited on the sidewalls of the backside contact openings and over the top surface of the insulating cap layer 70 constitutes the conformal dielectric layer. The source-select-level insulating layers 16 and the control-gate-level insulating layers 36 are collectively referred to as insulating layers (16, 36).

The thickness of the deposited dielectric material can be selected such that the control-gate-level backside cavities 33 are completely filled by the control-gate-level insulating layers 36, and the backside contact cavities are not completely filled by the conformal dielectric layer. Thus, a backside contact cavity is present within each backside contact opening after formation of the conformal dielectric layer. The dielectric material of the control-gate-level insulating layers 36 and the conformal dielectric layer can be silicon oxide, silicon nitride, organosilicate glass, a dielectric metal oxide, or a combination thereof.

Each of the metal-semiconductor alloy layers (26, 46) can be an electrically conductive layer. An alternating stack (16, 36, 26, 46) of layers comprising insulating layers (16, 36) and electrically conductive layers (i.e., the metal-semiconductor alloy layers (26, 46)) is formed. Each insulating layer (16, 36) comprises a dielectric material portion deposited within a respective backside cavity (13, 33). Each electrically conductive layer, i.e., each metal-semiconductor alloy layers (26, 46), comprises a material from a portion of a respective second epitaxial semiconductor layer (24, 44) and at least one metal from the metal layer 45L. In one case, each of the electrically conductive layers (26, 46) can consist of a metal-semiconductor alloy layer comprising a metal-semiconductor alloy (e.g., a metal silicide) of the second single crystalline semiconductor material and at least one elemental metal.

The second exemplary structure can comprise a monolithic three-dimensional memory device. The monolithic three-dimensional memory device comprises a stack of layers comprising insulating layers (16, 36) and electrically conductive layers (26, 46) and located over a substrate, a memory stack structure 55 extending through the stack and comprising, from outside to inside, a memory film (48, 54, 56) and a vertical semiconductor channel 60. Each of the electrically conductive layers (26, 46) comprises a metal-semiconductor portion. In one embodiment, each of the electrically conductive layers (26, 46) consists of a metal-semiconductor alloy portion. In one embodiment, the entirety of each metal-semiconductor alloy portion of electrically conductive layers (26, 46) is single crystalline.

In one embodiment, an entire volume defined by surfaces of each electrically conductive layer (26, 46) is filled with a same metal-semiconductor alloy material. The metal semiconductor alloy material of the electrically conductive layers (26, 46) can comprise a metal silicide. Each of the electrically conductive layers (26, 46) can contact an outer sidewall of the memory stack structure 55.

A backside contact via structure 76 can extend through the stack (16, 36, 26, 46), and can contact a portion of the substrate, which can be a source region 72. An insulating spacer 74 laterally surrounds the backside contact via structure 76. Each of the electrically conductive layers (26, 46) contacts an outer sidewall of the insulating spacer 74.

In one embodiment, the monolithic three-dimensional memory device can be a vertical NAND memory device, and one or more of the electrically conductive layers (26, 46) comprise, or are electrically connected to, a respective word line of the vertical NAND memory device. For example, the control-gate-level second epitaxial semiconductor layers 46 can comprise word lines of the vertical NAND memory device. Further, one or more source select level gate electrodes 26 can be located underneath the word lines of the vertical NAND memory device. For example, the one or more source-select-level metal-semiconductor alloy layers 26 can comprise the one or more source select level gate electrodes. Each source select level gate electrode comprises a metal-semiconductor alloy layer.

In one embodiment, the substrate can comprise a silicon substrate, and the NAND memory device can comprise an array of monolithic three-dimensional NAND strings over the silicon substrate. At least one memory cell in the first device level of the three-dimensional array of NAND strings can be located over another memory cell in the second device level of the three-dimensional array of NAND strings. The silicon substrate can contain an integrated circuit comprising a driver circuit for the memory device located thereon. The array can comprise a plurality of semiconductor channels. At least one end portion of each of the plurality of semiconductor channels extends substantially perpendicular to a top surface of the semiconductor substrate. Each NAND string can comprise a plurality of charge storage elements. Each charge storage element can be located adjacent to a respective one of the plurality of semiconductor channels, e.g., within a memory film (48, 54, 56). Each NAND string can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

Figure 13:
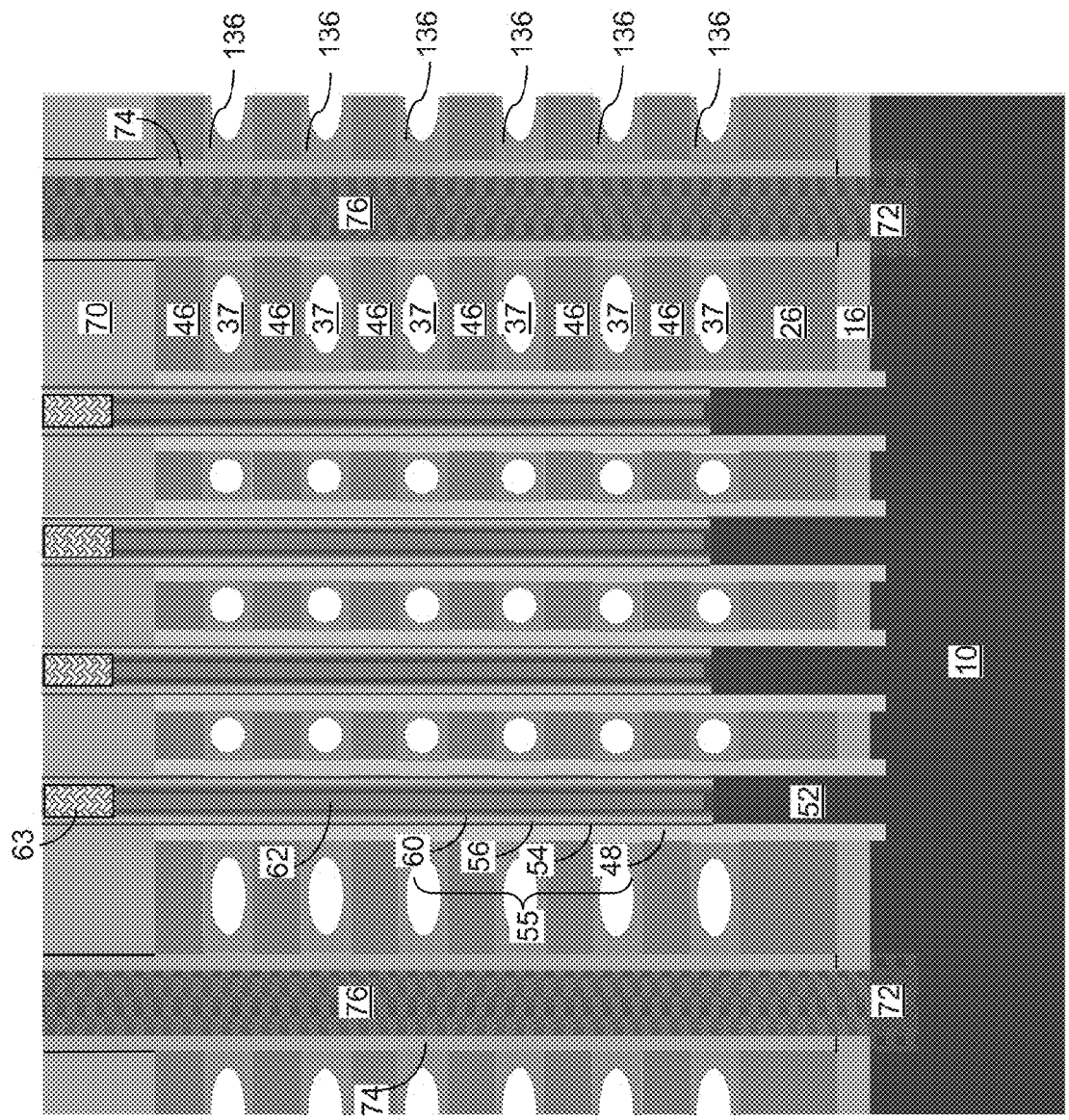
FIG. 13 is an alternate embodiment of the second exemplary structure according to the second embodiment of the present disclosure.

Referring to FIG. 13, an alternate embodiment of the second exemplary structure can be derived from the second exemplary structure of FIG. 11 by employing a non-conformal deposition process to deposit a dielectric material within the control-gate-level backside cavities 33 in lieu of a conformal deposition process. The portions of the deposited dielectric material that fill the volumes of the control-gate-level backside cavities 33 constitute control-gate-level insulating layers 136. The contiguous portion of the deposited dielectric material that is deposited on the sidewalls of the backside contact openings 79 and over the top surface of the insulating cap layer 70 constitutes a non-conformal contiguous dielectric layer. The source-select-level insulating layers 16 and the control-gate-level insulating layers 136 are collectively referred to as insulating layers (16, 136).

In this case, each control-gate-level insulating layer 136 that is formed within an insulator-level backside cavity 33 can have at least one encapsulated cavity 37 therein. As used herein, an "encapsulated cavity" refers to a cavity located within a sealed volume defined by a set of surfaces that does not include any opening therein. The maximum dimension of the encapsulated cavities 37 within each control-gate-level insulating layer 136 can be greater than 3 nm, and can be greater than 10 nm. The control-gate-level insulating layers 136 comprise a dielectric material such as silicon oxide, silicon oxynitride, and/or organosilicate glass. The control-gate-level insulating layers 136 can be formed, for example, by plasma enhanced chemical vapor deposition (PECVD) or high density plasma chemical vapor deposition (HDPCVD), which are non-conformal deposition methods. In one embodiment, the insulating layers (16, 136) can be formed employing a conformal deposition process, and thus, do not include cavities therein.

The processing steps of FIG. 7 can be subsequently performed to form insulating spacers 74, the backside contact via structures 76, and the drain regions 63. The insulating spacers 74 of FIG. 13 can have a tapered profile, i.e., a vertically changing thickness that is lesser at a lower portion and greater at an upper portion. The exemplary structure of FIG. 12 can be modified such that each of the control-gate-level insulating layers 136 in the stack (16, 136, 26, 46) comprises at least one cavity 37 embedded therein as shown in FIG. 13. Alternatively, the insulating layers 16 and/or 136 may be omitted entirely such that cavities 33 become encapsulated cavities after formation of the spacers 74.

Figure 14:
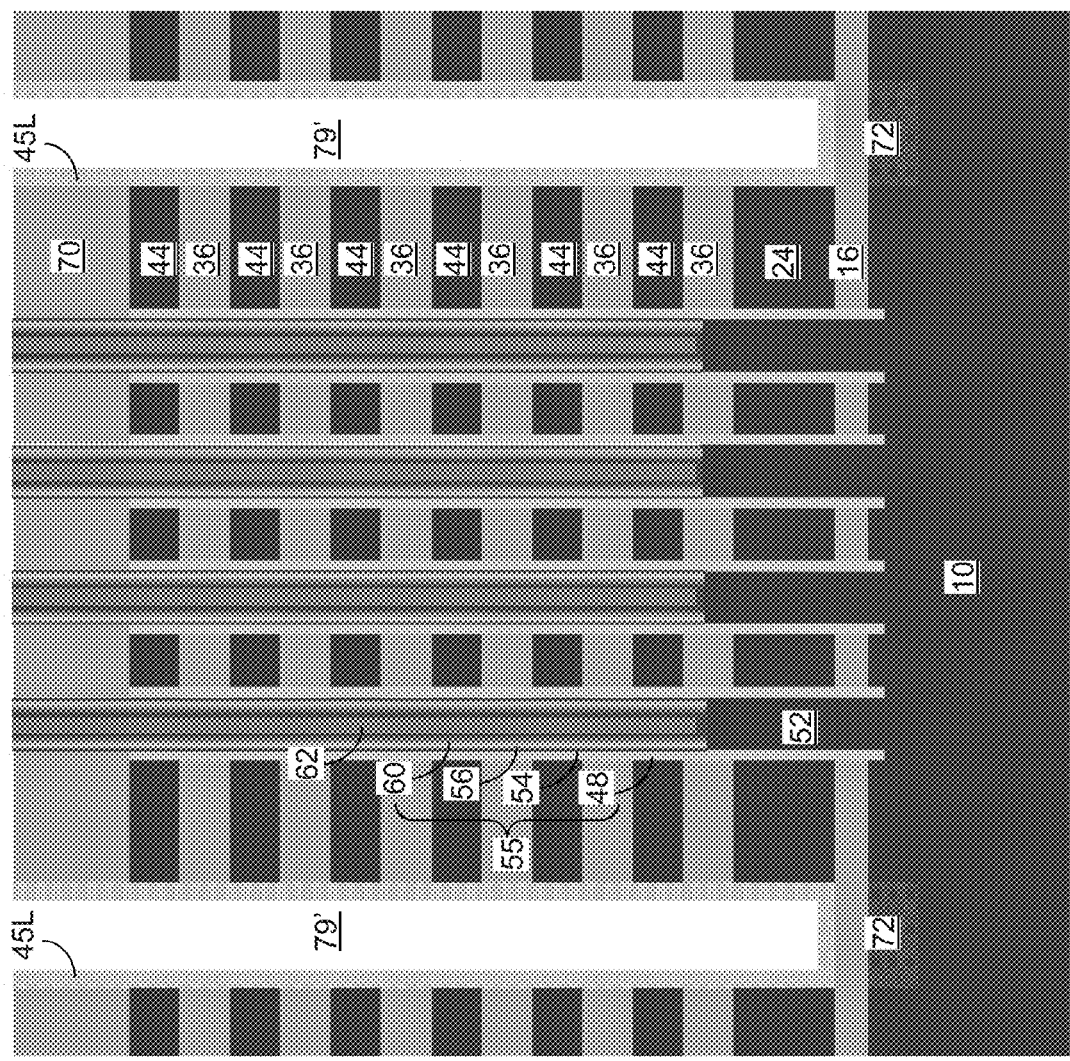
FIG. 14 is a vertical cross-sectional view of a third exemplary structure after formation of insulator-level backside cavities, insulating layers, and a metal layer according to a third embodiment of the present disclosure.

Referring to FIG. 14, a third exemplary structure according to a third embodiment of the present disclosure can be derived from the second exemplary structure of FIG. 9 by depositing a metal layer 45L on sidewalls of the backside contact openings 79. The metal layer 45L can be deposited employing the same processing step as the processing step for depositing the metal layer 45L of FIG. 10. The metal layer 45L can be deposited on the vertical surfaces of the second epitaxial semiconductor layers (24, 44) and on the vertical surfaces of the control-gate-level insulator layers 36. The metal layer 45L comprises at least one elemental metal that forms a metal-semiconductor alloy upon anneal. In one embodiment, the second epitaxial semiconductor layers (24, 44) can comprise silicon or a silicon-containing alloy, and the metal layer 45L can comprise a material that forms a metal silicide. For example, the metal layer 45L can comprise an elemental metal or an alloy of elemental metals, which can be selected from nickel, cobalt, titanium, tantalum, tungsten, platinum, or a combination thereof. A backside contact cavity 79' can be present within each backside contact opening after formation of the metal layer 45L. The metal layer 45L can be formed as a single contiguous layer.

Figure 15:
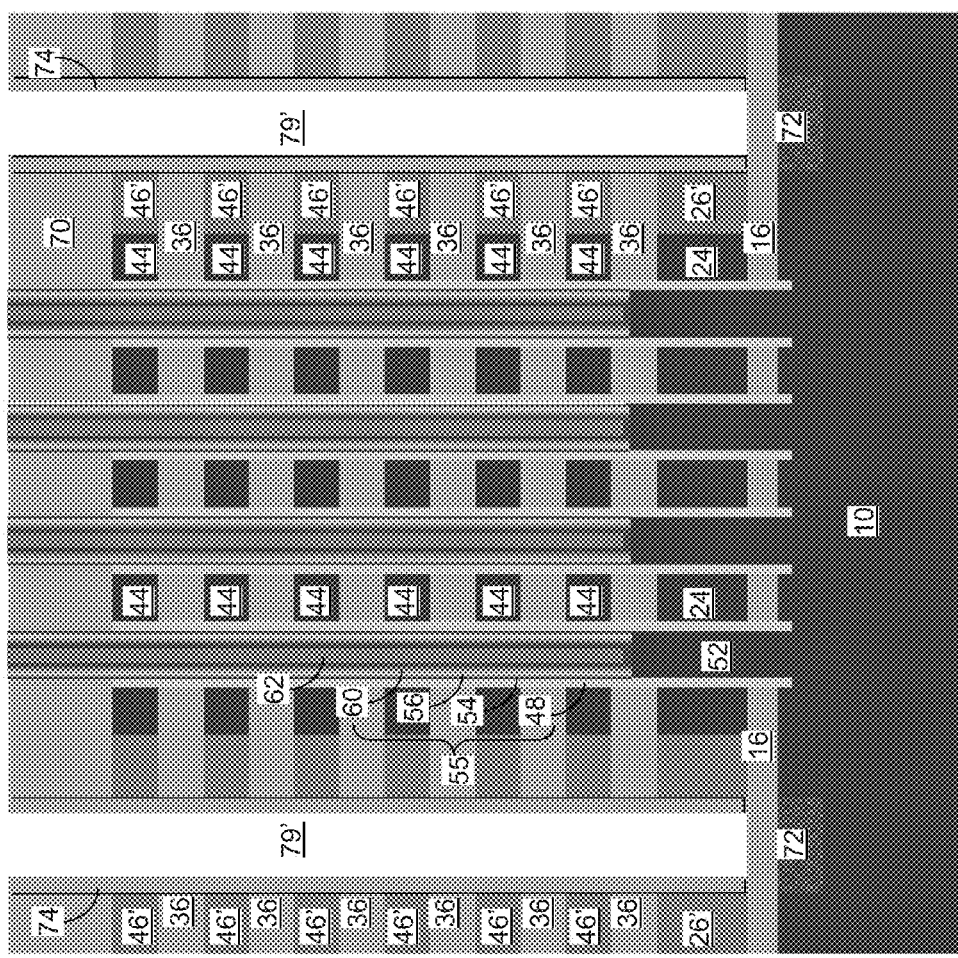
FIG. 15 is a vertical cross-sectional view of the third exemplary structure after formation of metal-semiconductor alloy portions and insulating spacers according to the third embodiment of the present disclosure.

Referring to FIG. 15, reaction between the metal layer 45L and proximal portions of the second epitaxial semiconductor layers (24, 44) located adjacent to the metal layer 45L is induced employing an anneal process. The anneal proves converts the proximal portion of each second epitaxial semiconductor layer (24, 44) into a metal-semiconductor alloy portion, while maintaining intact a distal portion of each second epitaxial semiconductor layer (24, 44). Metal-semiconductor alloy portions (26', 46') are formed from the reacted portions of the metal layer 45L and the second epitaxial semiconductor layers (24, 44). A portion of each second epitaxial semiconductor layer (26, 46) can be converted into a metal-semiconductor alloy portion (26', 46') by reacting the metal layer 45L with the second epitaxial semiconductor layers (24, 44) employing the anneal process. Specifically, the anneal process is performed at an elevated temperature to induce metallization of the semiconductor material of the second epitaxial semiconductor layers (24, 44), thereby converting portions of the second epitaxial semiconductor layers (24, 44) into a respective metal-semiconductor alloy portion (26', 46'). The elevated temperature can be in a range from 400 degrees Celsius to 800 degrees Celsius, although lower and higher temperatures can also be employed.

The metal-semiconductor alloy portions (26', 46') include one or more source-select-level metal-semiconductor alloy portions 26' and control-gate-level metal-semiconductor alloy portions 46'. Each metal-semiconductor alloy portion (26', 46') is an electrically conductive material portion. A contiguous remaining portion of each second epitaxial semiconductor layers (24, 44) can laterally surround a plurality of memory stack structures 55, and can laterally contact at least one metal-semiconductor alloy portion (26', 46'). Each contiguous set of a second epitaxial semiconductor layer (24, 44) and at least one metal-semiconductor alloy portion (26', 46') located within the same level constitutes an electrically conductive layer {(24, 26') or (44, 46')}. Thus, each electrically conductive layer {(24, 26') or (44, 46')} comprises a respective metal-semiconductor alloy portion (26', 46'). In one embodiment, the anneal process converts a portion of each second epitaxial semiconductor layer (24, 44) into a metal-semiconductor alloy portion (26', 46'), while leaving another portion of the respective second epitaxial semiconductor layer (24, 44) intact. In one embodiment, each metal-semiconductor alloy portion 46' can be single crystalline. Alternatively, the metal-semiconductor alloy portion 46' may be polycrystalline.

In one embodiment, each electrically conductive layer {(24, 26') or (44, 46')} comprises a metallic material portion laterally contacting a respective single crystalline doped semiconductor material portion, which is a second epitaxial semiconductor layer (24, 44). The metallic material portion, i.e., the metal-semiconductor alloy portion 46', comprises a metal-semiconductor alloy of the semiconductor material of the single crystalline doped semiconductor material portions and a metal, which is derived from the metal layer 45L. In one embodiment, each metallic material portion, i.e., the metal-semiconductor alloy portion 46', is a single crystalline metal-semiconductor alloy portion.

A stack (16, 36, 24, 44, 26, 46) of layers is formed, which comprises insulating layers (16, 36) and electrically conductive layers (24, 44, 26, 46). Each insulating layer (16, 36) comprises a dielectric material portion deposited within a respective backside cavity (13, 33). Each electrically conductive layer (24, 44, 26, 46) comprises a material from a portion of a respective second epitaxial semiconductor layer (24, 44) as provided at the processing steps of FIG. 14. Each of the electrically conductive layers (24, 44, 26, 46) comprises a metallic material portion, i.e., a metal-semiconductor alloy portion (26', 46'), that is formed in a first volume of a respective second epitaxial semiconductor layer (24, 44) from which a portion of the respective epitaxial semiconductor layer (24, 44) is removed. Further, each of the electrically conductive layers (24, 44, 26, 46) comprises a single crystalline doped semiconductor material portion that is a remaining portion of the respective second epitaxial semiconductor layer (24, 44).

Subsequently, insulating spacers 74, backside contact via structures 76 (See FIGS. 7 and 12), and drain regions 63 (See FIGS. 7 and 12) can be formed in the same manner as in the first and second embodiments.

The third exemplary structure can comprise a monolithic three-dimensional memory device having substantially the same features as the first and second exemplary structures except for the modifications to the electrically conductive layers (24, 44, 26, 46). The monolithic three-dimensional memory device of the third embodiment comprises a stack of layers (16, 36, 24, 44, 26, 46) comprising insulating layers (16, 36) and electrically conductive layers (24, 44, 26, 46) and located over a substrate, and a memory stack structure 55 extending through the stack and comprising, from outside to inside, a memory film (48, 54, 56) and a vertical semiconductor channel 60.

In one embodiment, the substrate comprises a single crystalline semiconductor material layer 10 having the same crystal structure as the single crystalline doped semiconductor material portions of the second epitaxial semiconductor layers (24, 44). In one embodiment, the spatial orientations of crystallographic axes coincide between each of the single crystalline doped semiconductor material portions of the second epitaxial semiconductor layers (24, 44) and the single crystalline semiconductor material layer 10 for each Miller index. Optionally, the insulator layers (16, 36) may contain cavities 37 as illustrated in FIG. 13.

Figure 16:
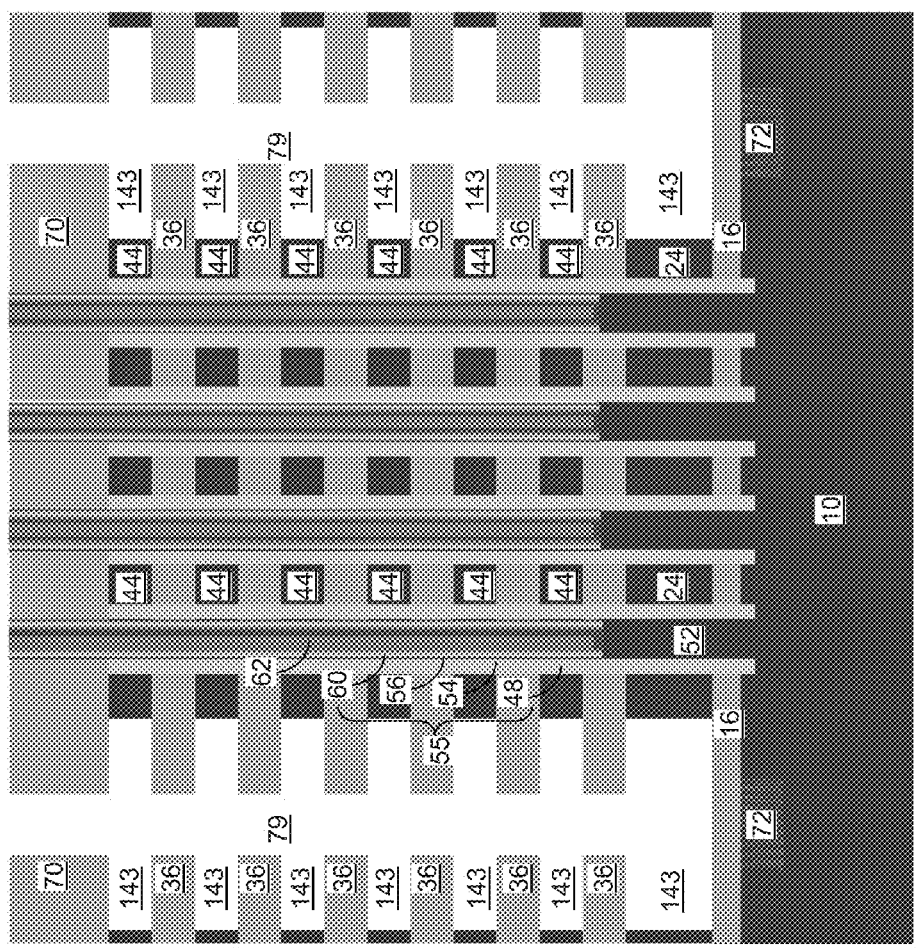
FIG. 16 is a vertical cross-sectional view of a fourth exemplary structure after lateral recessing of second epitaxial semiconductor layers according to a fourth embodiment of the present disclosure.

Referring to FIG. 16, a fourth exemplary structure according to a fourth embodiment of the present disclosure can be derived from the first exemplary structure of FIG. 6 by removing the conformal dielectric layer 74L by an isotropic etch such as a wet etch. After the sidewalls of the second epitaxial semiconductor layers (24, 44) are physically exposed on within the backside contact openings 79, the second epitaxial semiconductor layers (24, 44) are laterally recessed to form backside recesses 143. The backside recesses are formed at each level of the second epitaxial semiconductor layers (24, 44) and between each vertically neighboring pair of insulator layers (16, 36). Specifically, the backside recesses 143 can be formed by laterally removing proximal portions of each second epitaxial material layer (24, 44) from a sidewall of a backside contact opening 79 selective to the insulating layers (16, 36). Distal portions of the second epitaxial material layers (24, 44) constitute the single crystalline doped semiconductor material portions, which are the remaining portions of the each second epitaxial material layers (24, 44). A remaining portion of a second epitaxial material layer (24, 44) contacts sidewalls of, and laterally surrounds, a plurality of memory stack structures 55.

Figure 17:
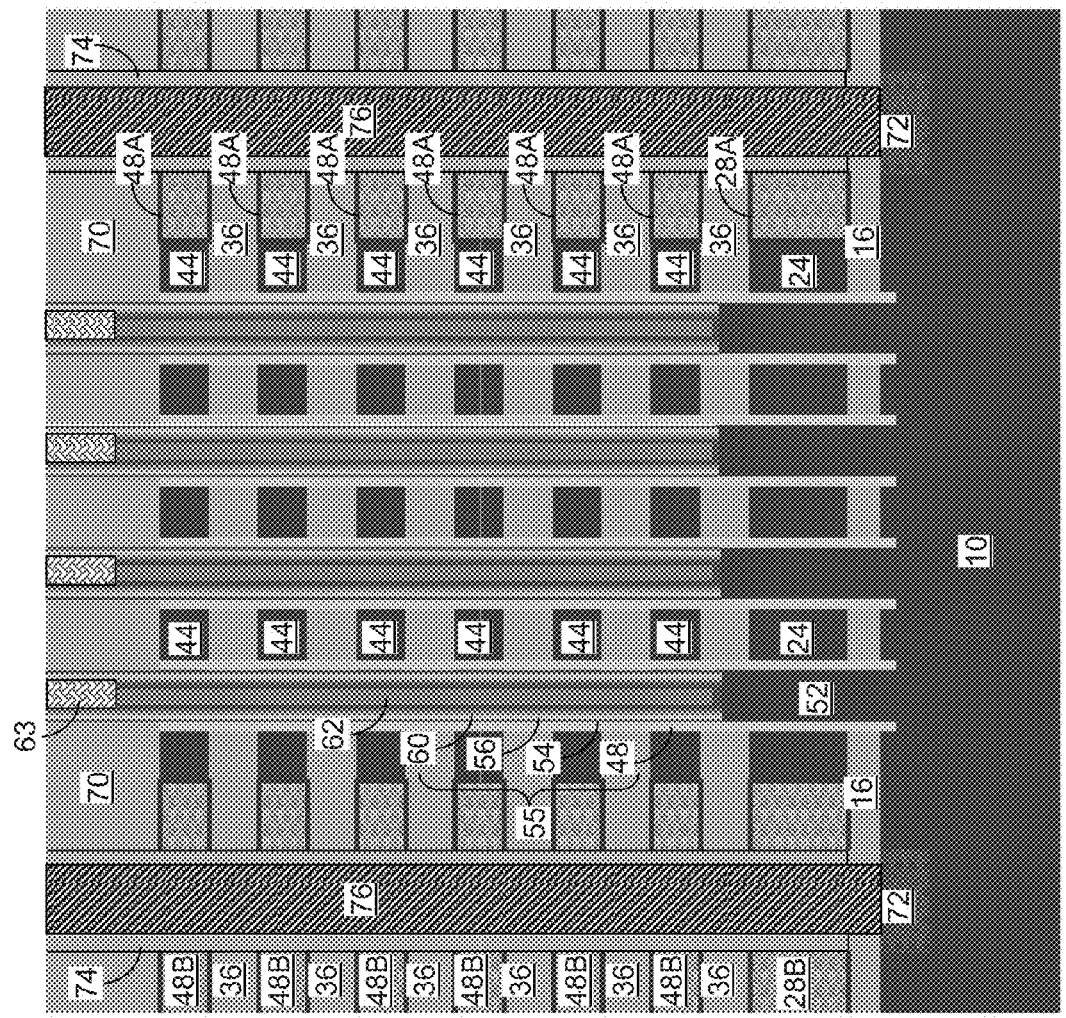
FIG. 17 is a vertical cross-sectional view of the fourth exemplary structure after formation of metallic conductive portions according to the fourth embodiment of the present disclosure.

Referring to FIG. 17, metallic conductive portions (28A, 28B, 38A, 48B) can be formed within the backside recesses 143 by conformal deposition of at least one metallic material, and removal of the at least one metallic material from within the backside contact openings by an etch process. The etch process removes the at least one metallic material selective to the dielectric materials of the insulating cap layer 70 and the insulator layers (16, 36), and selective to the semiconductor material of the source regions 72. Each metallic material portion (28A, 28B, 38A, 48B) can comprise a metallic liner portion (28A, 48A) that contacts sidewalls of a respective single crystalline doped semiconductor material portion, i.e., a remaining second epitaxial semiconductor layers (24, 44), and horizontal surfaces of the insulator layers (16, 36). Each metallic material portion (28A, 28B, 38A, 48B) can further comprise a metal fill portion (28B, 48B) that is laterally spaced from the respective single crystalline doped semiconductor material portion, i.e., the second epitaxial semiconductor layers (24, 44) located at the same level, and is vertically spaced from the insulator layers (16, 36) by a respective metallic liner portion (28A, 48A). In one embodiment, each metallic liner portion (28A, 48A) can comprise a metallic nitride (such as TiN, WN, TaN) or a metallic carbide (such as TiC), and each metal fill portion (28B, 48B) can comprise an elemental metal or an intermetallic alloy of at least two elemental metals. Alternatively, the metallic conductive portions may consist of metallic liner portions (28A, 28B) that fill the entire backside recesses 143.

The fourth exemplary structure comprises a stack of layers (16, 36, 24, 44, 28A, 28B, 48A, 48B) comprising insulating layers (16, 36) and electrically conductive layers (24, 44, 28A, 28B, 48A, 48B). Each insulating layer (16, 36) comprises a dielectric material portion deposited within a respective backside cavity 143 (see FIG. 16). Each electrically conductive layer (24, 44, 28A, 28B, 48A, 48B) comprises a material from a portion of a respective second epitaxial semiconductor layer (24, 44), which can be a remaining portion of the respective second epitaxial semiconductor layer (24, 44). Each of the electrically conductive layers (24, 44, 28A, 28B, 48A, 48B) further comprises a metallic material portion (28A, 28B, 48A, 48B) that is formed in a first volume of a respective second epitaxial semiconductor layer (24, 44) from which a portion of the respective epitaxial semiconductor layer (24, 44) is removed.

A conformal dielectric layer can be formed in the backside contact openings and over the insulating cap layer employing the same processing steps as the processing steps of FIG. 6. An anisotropic etch can be performed to remove horizontal portions of the conformal dielectric layer in the same manner as in the processing steps of FIG. 7. Backside contact via structures 76 and drain regions 63 can be formed in the same manner as in the first embodiment.

The fourth exemplary structure can comprise a monolithic three-dimensional memory device. The monolithic three-dimensional memory device comprises a stack of layers comprising insulating layers (16, 36) and electrically conductive layers (24, 44, 28A, 28B, 48A, 48B) and located over a substrate, a memory stack structure 55 extending through the stack and comprising, from outside to inside, a memory film (48, 54, 56) and a vertical semiconductor channel 60. Each of the electrically conductive layers (24, 44, 28A, 28B, 48A, 48B) comprises a single crystalline doped semiconductor material portion, i.e., a second epitaxial semiconductor layer (24, 44), and at least one metallic material portion (28A, 28B, 48A, 48B).

In one embodiment, the substrate comprises a single crystalline semiconductor material layer 10 having a same crystal structure as the single crystalline doped semiconductor material portions. Spatial orientations of crystallographic axes coincide between each of the single crystalline doped semiconductor material portions and the single crystalline semiconductor material layer 10 for each Miller index. In one embodiment, the single crystalline doped semiconductor material portions comprise single crystalline doped silicon portions. In one embodiment, each of the single crystalline doped semiconductor material portions contacts an outer sidewall of a memory stack structure 55.

In one embodiment, an entire volume within surfaces of each of the insulating layers is filled with a dielectric material. Alternatively, cavities 37 may be formed inside the insulator layers (16, 36). A backside contact via structure 76 extends through the stack (16, 36, 24, 44, 28A, 28B, 48A, 48B) and contacts a portion of the substrate, e.g., a source region 72. An insulating spacer 74 laterally surrounds the backside contact via structure 76. Each of the electrically conductive layers (24, 44, 28A, 28B, 48A, 48B) contacts an outer sidewall of the insulating spacer 74.

In one embodiment, the monolithic three-dimensional memory device can be a vertical NAND memory device, and one or more of the electrically conductive layers (24, 44, 28A, 28B, 48A, 48B) comprise, or are electrically connected to, a respective word line of the vertical NAND memory device. For example, each combination of a control-gate-level second epitaxial semiconductor layers 44 and a metallic material portion (48A, 48B) located at the same level can comprise word lines of the vertical NAND memory device. Further, one or more source select level gate electrodes 24 can be located underneath the word lines of the vertical NAND memory device. For example, each combination of a source-select-level second epitaxial semiconductor layer 24 and a metallic material portion (28A, 28B) located at the same level can comprise a source select level gate electrode. Each source select level gate electrode comprises a single crystalline doped semiconductor material portion and a metallic portion.

In one embodiment, the monolithic three-dimensional memory device can comprise an epitaxial pedestal channel region 52 located at a bottom portion of the memory stack structure 55 and laterally surrounded by the source select level gate electrode (24, 28A, 28B). The single crystalline doped semiconductor material portions (24, 44) of the electrically conductive layers (24, 44, 28A, 28B, 48A, 48B) and the epitaxial pedestal channel region 52 can have a same crystal structure. Further, spatial orientations of crystallographic axes coincide between the single crystalline doped semiconductor material portions (24, 44) and the epitaxial pedestal channel region 52 for each Miller index.

In one embodiment, the substrate can comprise a silicon substrate, and the NAND memory device can comprise an array of monolithic three-dimensional NAND strings over the silicon substrate. At least one memory cell in the first device level of the three-dimensional array of NAND strings can be located over another memory cell in the second device level of the three-dimensional array of NAND strings. The silicon substrate can contain an integrated circuit comprising a driver circuit for the memory device located thereon. The array can comprise a plurality of semiconductor channels. At least one end portion of each of the plurality of semiconductor channels extends substantially perpendicular to a top surface of the semiconductor substrate. Each NAND string can comprise a plurality of charge storage elements. Each charge storage element can be located adjacent to a respective one of the plurality of semiconductor channels, e.g., within a memory film (48, 54, 56). Each NAND string can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device, comprising:
   a stack of layers comprising insulating layers and electrically conductive layers located over a substrate;
   a memory opening extending through an entirety of the stack of layers and defining a continuous set of sidewalls of the stack of layers; and
   a memory stack structure located in the memory opening and extending through the stack of layers and comprising, from outside to inside, a memory film and a polysilicon vertical semiconductor channel,
   wherein each of the electrically conductive layers comprises at least one of a single crystalline doped semiconductor material portion and a single crystalline metal-semiconductor alloy portion; and
   wherein each electrically conductive layer within the stack of layers includes a respective hole therethrough that coincides entirely with the memory opening at a respective level, and each electrically conductive layer completely laterally surrounds and completely encircles the memory stack structure.

2. The monolithic three-dimensional memory device of claim 1, wherein:
   each of the electrically conductive layers comprises the single crystalline doped semiconductor material portion;
   the substrate comprises a single crystalline semiconductor material layer having a same crystal structure as the single crystalline doped semiconductor material portions; and
   spatial orientations of crystallographic axes coincide between each of the single crystalline doped semiconductor material portions and the single crystalline semiconductor material layer for each Miller index.

3. The monolithic three-dimensional memory device of claim 2, wherein the single crystalline doped semiconductor material portions comprise single crystalline doped silicon portions.

4. The monolithic three-dimensional memory device of claim 2, wherein each of the single crystalline doped semiconductor material portions contacts an outer sidewall of the memory stack structure.

5. The monolithic three-dimensional memory device of claim 2, wherein each of the electrically conductive layers consists entirely of a respective single crystalline doped semiconductor material portion.

6. The monolithic three-dimensional memory device of claim 5, wherein each of the insulating layers in the stack of layers comprises at least one cavity embedded therein.

7. The monolithic three-dimensional memory device of claim 5, wherein an entire volume within surfaces of each of the insulating layers is filled with a dielectric material.

8. The monolithic three-dimensional memory device of claim 2, further comprising:
   a backside contact via structure extending through the stack of layers and contacting a portion of the substrate; and
   an insulating spacer laterally surrounding the backside contact via structure,
   wherein each of the electrically conductive layers contacts an outer sidewall of the insulating spacer.

9. The monolithic three-dimensional memory device of claim 2, wherein each electrically conductive layer comprises a metallic material portion laterally contacting a respective single crystalline doped semiconductor material portion.

10. The monolithic three-dimensional memory device of claim 9, wherein the metallic material portion comprises the single crystalline metal-semiconductor alloy portion of the single crystalline doped semiconductor material portions and a metal.

11. The monolithic three-dimensional memory device of claim 9, wherein each metallic material portion is a single crystalline metal silicide portion.

12. The monolithic three-dimensional memory device of claim 9, wherein the metallic material portion comprises:
   a metallic liner portion comprising a metal nitride or a metal carbide and contacting the respective single crystalline doped semiconductor material portion; and
   a metal fill portion comprising an elemental metal or an intermetallic alloy of at least two elemental metals and laterally spaced from the respective single crystalline doped semiconductor material portion by the metallic liner portion.

13. The monolithic three-dimensional memory device of claim 1, wherein:
   the monolithic three-dimensional memory device is a vertical NAND memory device; and
   one or more of the electrically conductive layers comprise, or are electrically connected to, a respective word line of the vertical NAND memory device.

14. The monolithic three-dimensional memory device of claim 13, wherein the electrically conductive layers comprises a source select level gate electrode underlying the at least one word line.

15. The monolithic three-dimensional memory device of claim 14, further comprising an epitaxial pedestal channel region located at a bottom portion of the memory stack structure and laterally surrounded by the source select level gate electrode, wherein:
   the single crystalline doped semiconductor material portions and the epitaxial pedestal channel region have a same crystal structure; and
   spatial orientations of crystallographic axes coincide between the single crystalline doped semiconductor material portion and the epitaxial pedestal channel region for each Miller index.

16. The monolithic three-dimensional memory device of claim 13, wherein:
   the substrate comprises a silicon substrate;
   the NAND memory device comprises an array of monolithic three-dimensional NAND strings over the silicon substrate;
   at least one memory cell in the first device level of the three-dimensional array of NAND strings is located over another memory cell in the second device level of the three-dimensional array of NAND strings;
   the silicon substrate contains an integrated circuit comprising a driver circuit for the memory device located thereon; and
   the three-dimensional array of NAND strings comprises:
   a plurality of the vertical semiconductor channels, wherein at least one end portion of each of the plurality of semiconductor channels extends substantially perpendicular to a top surface of the semiconductor substrate;

a plurality of memory films containing charge storage elements, each charge storage element located adjacent to a respective one of the plurality of vertical semiconductor channels; and a plurality of the electrically conductive layers comprising a plurality of control gate electrodes having a strip shape extending substantially parallel to the top surface of the substrate, the plurality of control gate electrodes comprise at least a first control gate electrode located in the first device level and a second control gate electrode located in the second device level.

17. The monolithic three-dimensional memory device of claim 1, wherein each electrically conductive layer within the stack of layers physically contacts a respective portion of an outer sidewall of the memory opening.

18. The monolithic three-dimensional memory device of claim 1, wherein each insulating layer within the stack of layers includes a respective hole that coincides entirely with the memory opening at a respective level, and laterally surrounds and encircles the memory stack structure.

19. The monolithic three-dimensional memory device of claim 18, wherein each insulating layer within the stack of layers contacts a respective portion of an outer sidewall of the memory opening.

20. The monolithic three-dimensional memory device of claim 1, wherein an entirety of outer sidewalls of the memory stack structure at levels of the stack of layers is in physical contact with a set of surfaces consisting of sidewalls of the electrically conductive layers within the stack of layers and sidewalls of the insulating layers within the stack of layers.

21. The monolithic three-dimensional memory device of claim 1, wherein the memory opening extends below a horizontal plane including a top surface of the substrate.

22. The monolithic three-dimensional memory device of claim 1, wherein the memory film is a single continuous structure that extends continuously around the memory opening.

23. The monolithic three-dimensional memory device of claim 1, wherein each outer sidewall of the vertical semiconductor channel contacts an inner sidewall of the memory film.

24. The monolithic three-dimensional memory device of claim 1, wherein a physical contact area between each electrically conductive layer and the memory stack structure azimuthally extends by 360 degrees around a geometrical center of the memory opening.

* * * * *